United States Patent
Makita et al.

(10) Patent No.: US 6,521,821 B2
(45) Date of Patent: *Feb. 18, 2003

(54) FIXING MEMBER, A SOLAR CELL MODULE ARRAY USING SAID FIXING MEMBER, AND A METHOD FOR INSTALLING A SOLAR CELL MODULE OR A ROOFING MEMBER USING SAID FIXING MEMBER

(75) Inventors: Hidehisa Makita, Kyotanabe (JP); Kimitoshi Fukae, Nara (JP); Tatsuo Fujisaki, Nara (JP)

(73) Assignee: Canon Kabushiki Kaisha, Tokyo (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/221,145

(22) Filed: Dec. 28, 1998

(65) Prior Publication Data

US 2001/0050101 A1 Dec. 13, 2001

(30) Foreign Application Priority Data

Dec. 27, 1997 (JP) ................................. 9-368007

(51) Int. Cl.⁷ .......................... H01L 25/00; H01L 31/00; E04D 13/18
(52) U.S. Cl. ....................... 136/244; 136/251; 136/291; 52/173.1; 52/173.2; 52/173.3
(58) Field of Search ................... 136/251, 291, 136/244; 257/433; 52/291, 173.1, 173.2, 173.3; 126/623

(56) References Cited

U.S. PATENT DOCUMENTS

| | | | | | |
|---|---|---|---|---|---|
| 4,390,010 A | * | 6/1983 | Skillman | ..................... | 126/450 |
| 4,755,231 A | * | 7/1988 | Kurland et al. | ............. | 136/244 |
| 5,092,939 A | * | 3/1992 | Nath et al. | .................... | 136/251 |
| 5,232,518 A | * | 8/1993 | Nath et al. | .................... | 136/251 |
| 5,409,549 A | * | 4/1995 | Mori | .......................... | 136/244 |
| 5,509,246 A | * | 4/1996 | Roddy | .......................... | 52/533 |
| 5,589,006 A | * | 12/1996 | Itoyama et al. | ............. | 136/248 |
| 5,594,325 A | * | 1/1997 | Manner | ...................... | 323/282 |
| 5,600,971 A | * | 2/1997 | Suk | ................................ | 52/713 |
| 5,651,837 A | * | 7/1997 | Ohtsuka et al. | ............. | 136/251 |
| 5,787,653 A | * | 8/1998 | Sakai et al. | ................. | 52/173.3 |
| 5,849,107 A | | 12/1998 | Itoyama et al. | ............. | 136/248 |

FOREIGN PATENT DOCUMENTS

CA  2136790  * 5/1995  ......... H01L/31/058

* cited by examiner

Primary Examiner—Harold Pyon
Assistant Examiner—Michael C. Miggins
(74) Attorney, Agent, or Firm—Fitzpatrick, Cella, Harper & Scinto

(57) ABSTRACT

A fixing member for fixing a solar cell module or a roofing member with no solar cell onto an installation face, said fixing member comprising a meshing portion to mesh at least a solar cell module or a part of a roofing member with no solar cell; a fixing portion to fix said fixing member to said installation face; and a raised portion to connect said meshing portion and said fixing portion, wherein said raised portion has a height which is greater than the thickness of a portion of said solar cell module or said roofing member which is engaged in the meshing by said meshing portion.

26 Claims, 26 Drawing Sheets

F I G. 11
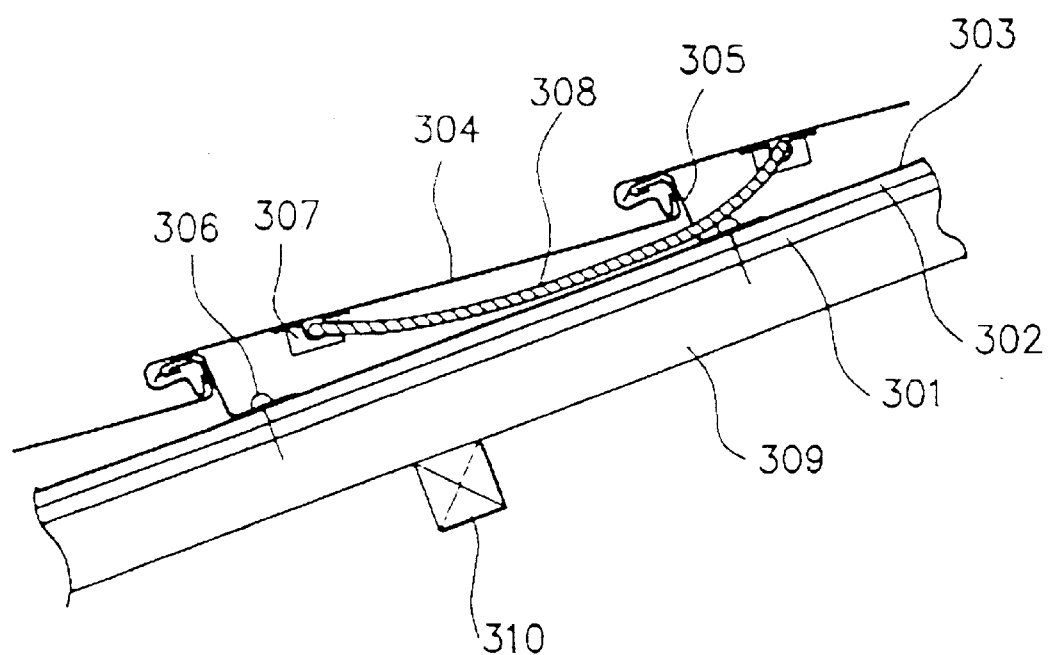

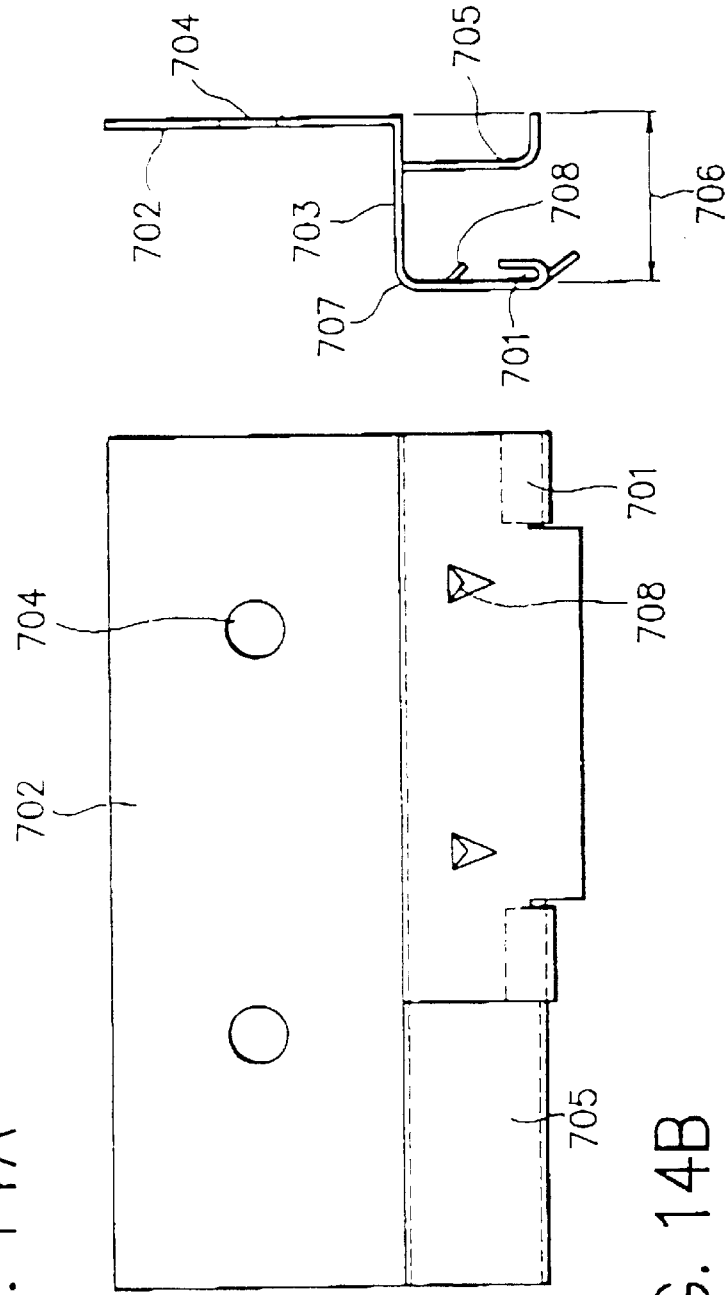
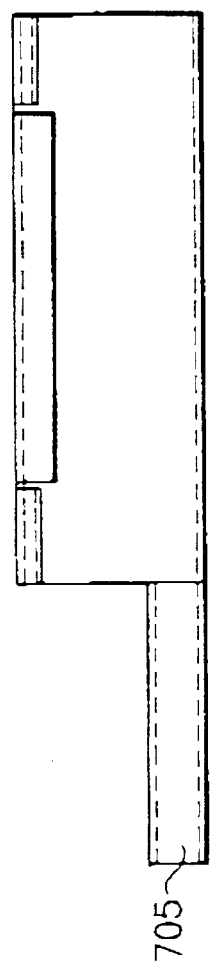
FIG. 14A  FIG. 14B  FIG. 14C

F I G. 15
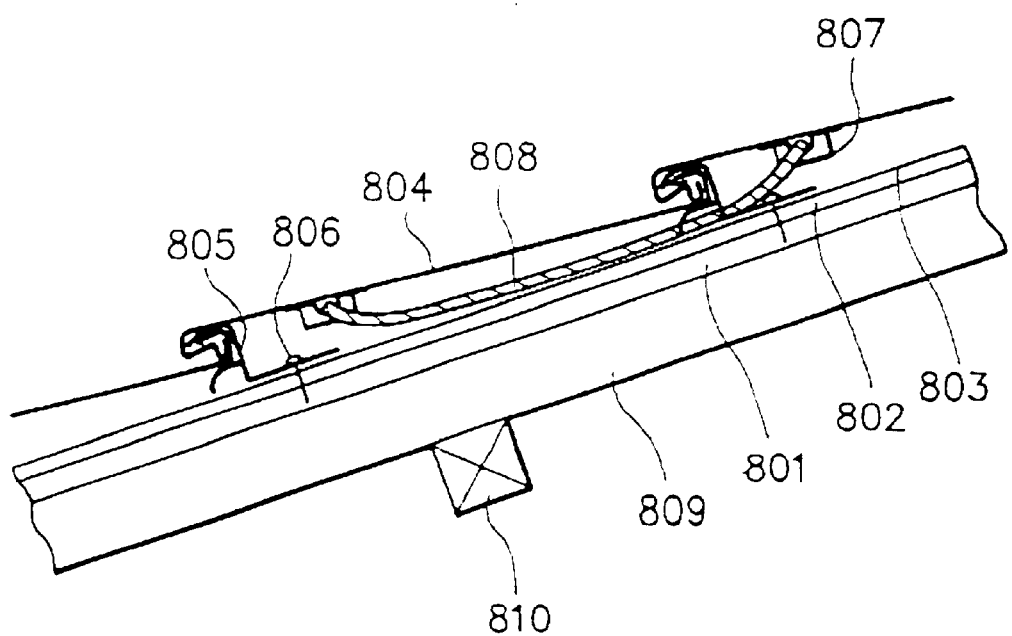

F I G. 22
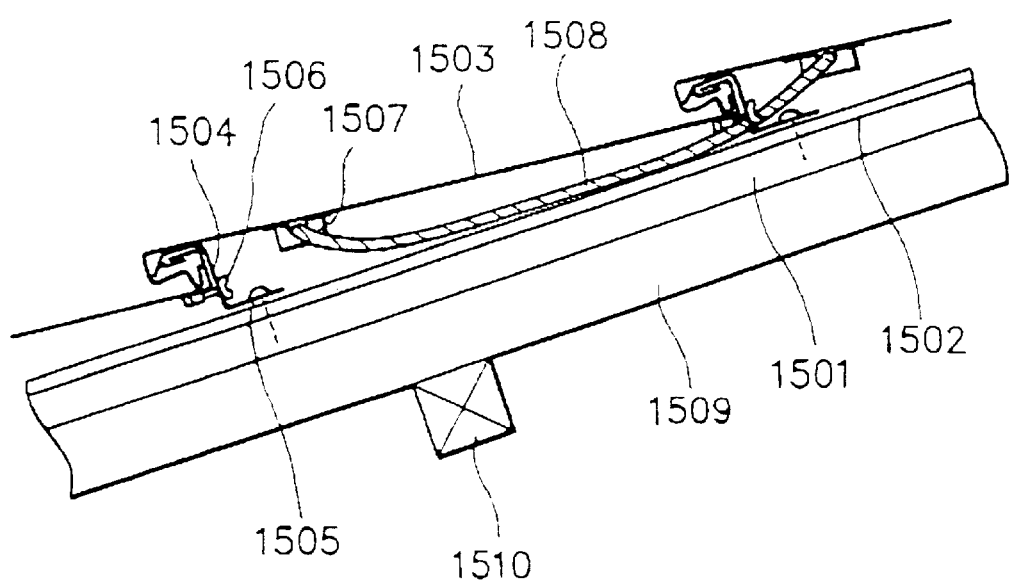

F I G. 25
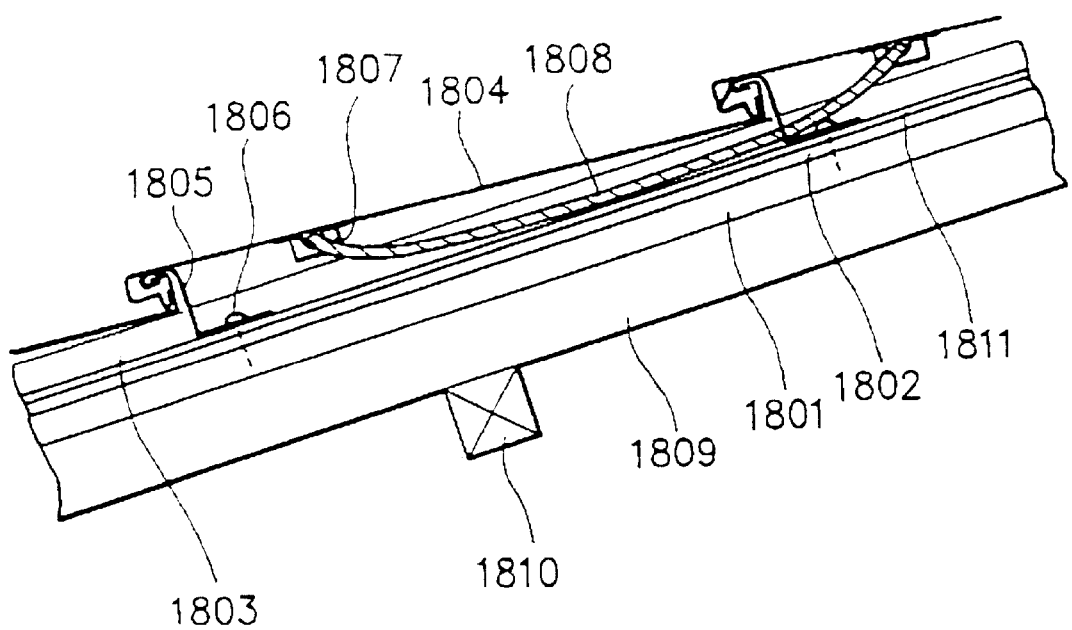

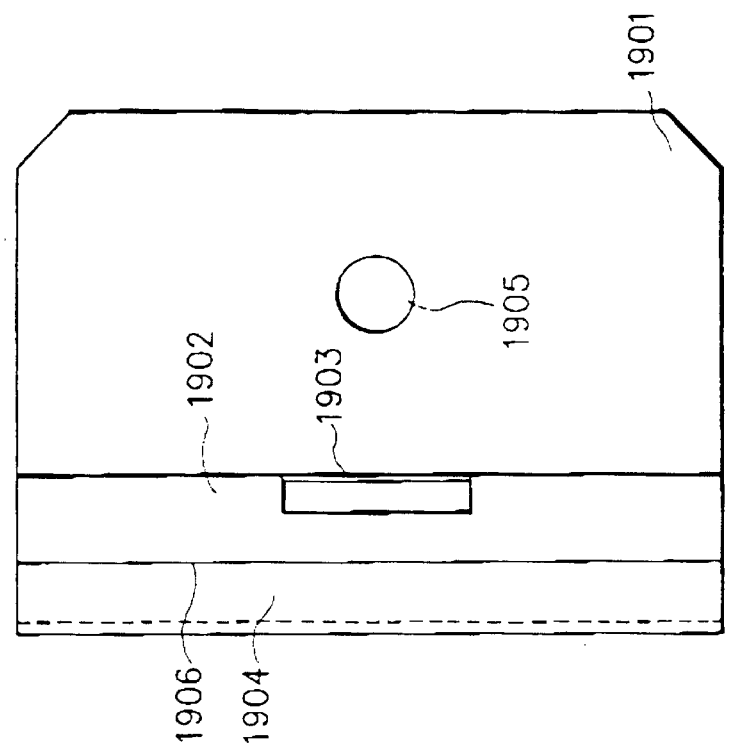
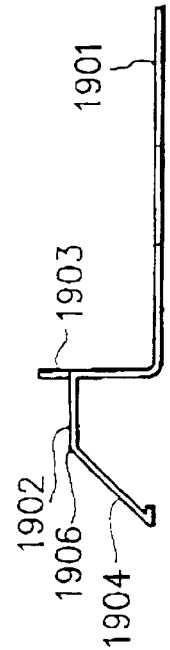
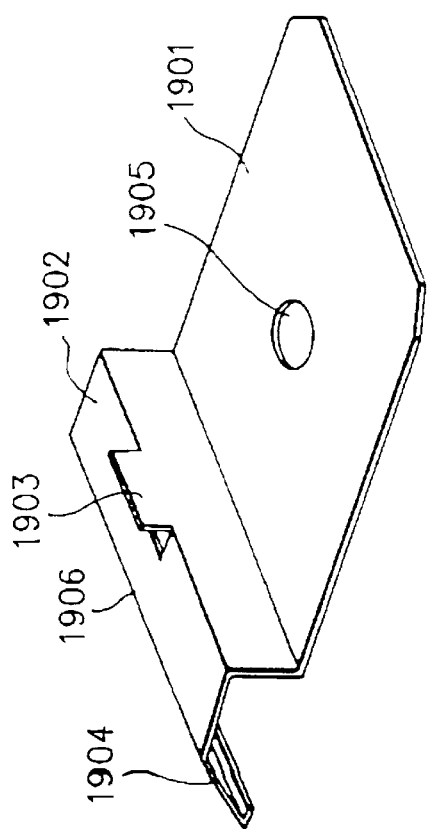
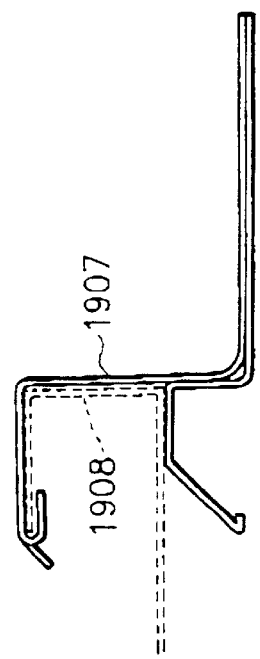

FIXING MEMBER, A SOLAR CELL
MODULE ARRAY USING SAID FIXING
MEMBER, AND A METHOD FOR
INSTALLING A SOLAR CELL MODULE OR
A ROOFING MEMBER USING SAID FIXING
MEMBER

BACKGROUND OF THE INVENTION

1. Field of the Invention

The present invention relates to a fixing member for fixing a solar cell module or a roofing member with no solar cell to a prescribed installation face, a solar cell module array using said fixing member, and an execution method for installing a solar cell module or a roofing member with no solar cell using said fixing member.

2. Related Background Art

In general, in the installation of a solar cell module, particularly a roofing member integral type solar cell module on a roof face, it is necessary to establish a prescribed space for connecting cables extending from the solar cell module. This is due to the following reason. For instance, as shown in FIG. 1, when a solar cell module-integrated roofing member for a stepping roof (Bermuda-type roof) is installed in the ordinary manner, the rear face of a ridge side end portion of the solar cell module unavoidably touches the surface of the sheathing roof board, whereby the passage necessary for electrically connecting the neighboring solar cell modules arranged in the water flow direction is blockaded.

In FIG. 1, reference numeral 2101 indicates a solar cell module, reference numeral 2102 a junction box, reference numeral 2103 a waterproofing roofing member, reference numeral 2104 a sheathing roof board, reference numeral 2105 a rafter, reference numeral 2106 a main frame, reference numeral 2107 a tapping screw, reference numeral 2108 a fixing member, and reference numeral 2109 a clip.

In the case of a solar cell module-integrated roofing member (2201) for a ribbed seam roof having upward bent opposite end portions as shown in FIG. 2, since a junction box 2202 is provided at the rear face of the roofing member 2201, the bottom of the roofing member 2201 must be raised using a spacer 2205. In FIG. 2, reference numeral 2203 indicates a fixing member, reference numeral 2204 a tapping screw, reference numeral 2206 a waterproofing roofing member, and reference numeral 2207 a sheathing roof board.

In order to eliminate the foregoing disadvantages, there are known such manners as will be described below.

(1) A manner as shown in FIG. 3 in which a predetermined portion of a sheathing roof board 2301 is cut off to form a wiring gutter 2302 having a passage 2305 for a cable to pass through. Also, a manner as shown in FIG. 4 in which a predetermined portion of a sheathing roof board 2401 is cut off and a sheathing roof board having an area corresponding to the cut-off sheathing roof board portion is fixed onto a main frame 2403 to form a passage 2404 for a cable to pass through.

In FIG. 3, reference numeral 2303 indicates a rafter, reference numeral 2304 a main frame, and reference numeral 2306 a tapping screw. In FIG. 4, reference numeral 2402 indicates a rafter.

(2) A manner as shown in FIG. 2 (which has been explained before) or in FIG. 5 in which a spacer (2203, 2504) made of a wood or metal is fixed on a sheathing roof board (2207, 2506) and a solar cell module (2201, 2501) is fixed on the spacer to form a space for a cable to pass through.

In FIG. 5, reference numeral 2502 indicates a junction box, reference numeral 2503 a connection cable, reference numeral 2505 a waterproofing roofing member, reference numeral 2507 a rafter, reference numeral 2508 a main frame, reference numeral 2509 a fixing member, reference numeral 2510 a tapping screw, and reference numeral 2511 a clip.

(3) A manner in which a backing member (a heat insulating member) is arranged under the rear face of a solar cell module to form a space between the solar cell module and the backing member which allows a cable to pass through the space.

(4) A manner in which a solar cell module is curving-processed to have a corrugated form and a cable is passed through a space of the corrugated form.

However, the above-described manners have disadvantages as will be described below.

Any of the manners described in the above (1) can be employed only in the case of a gable roof (a rectangular roof) where cable connection positions in a shed direction on the roof face are constant.

For instance, in the case of a gable roof as shown in FIG. 6 in which the opposite end portions of solar cell module strings are situated on verge portions, it is sufficient that one or two cable-wiring passages 2605 are provided. However, in the case of a hip roof in a trapezoid form as shown in FIG. 7 where a plurality of solar cell modules are arranged in stepwise arrangements, their cable connection positions in a water flow direction are different from each other depending upon the arrangement stage. As a result, an appropriate cable-wiring gutter is necessary for each arrangement stage. This situation is disadvantageous in that the wiring gutter is required to be specifically designed for each arrangement stage, extra work is necessary to properly position the wiring gutters, and expenses rise accordingly.

In FIG. 6, reference numeral 2601 indicates a solar cell module, reference numeral 2602 an installation face on which solar cell modules are installed, reference numeral 2603 a junction box, and reference numeral 2604 a connection cable. In FIG. 7, reference numeral 2701 indicates a solar cell module, reference numeral 2702 an installation face on which solar cell modules are installed, reference numeral 2703 a junction box, and reference numeral 2704 a connection cable.

Further, any of the manners described in the above (1) includes a step of cutting the sheathing roof board prior to installing the solar cell modules. As a result, there are disadvantages such that it takes a certain period of time to complete this step, and attention must be directed to the weathering problem which will be caused due to cutting the sheathing roof board. In addition, in the case where the wiring gutter is provided, an extra expense for providing the gutter is incurred.

The manner described in the above (2) is advantageous in that when the solar cell modules are installed, spaces are formed under the rear faces of the solar cell modules on the entire roof face. As a result, the cable connection positions in a water flow direction can be designed at optional locations. This is not restricted depending upon the form of a roof, i.e., gable roof or hip roof. However, there are disadvantages such that it is necessary to fix spacers to the sheathing roof board prior to installing the solar cell modules, whereby extra execution work and extra expenses are incurred. In addition, when using an underplate to join solar cell modules for stepping roofing which are arranged so as to neighbor with each other in a direction to the main frame and also to prevent a weathering problem, when the underplate is positioned on the spacers, portions of the underplate which are situated on the spacers protrude somewhat to mar the exterior appearance.

The manner described in the above (3) in which the cable connection space is formed by using the backing member under the rear face of the solar cell module has a disadvantage in that extra expenses are required for the backing member.

The manner described in the above (4) in which the solar cell is curving-processed has a disadvantage in that extra expenses are required for the solar cell module to be curving-processed.

SUMMARY OF THE INVENTION

A principal object of the present invention is to eliminate the foregoing disadvantages found in the prior art and to provide a fixing member which enables one to desirably install a solar cell module with a diminished number of execution steps and at a low installation cost and which enables one to establish a space which allows a connection cable extending from said solar cell module to pass through.

Another object of the present invention is to provide a solar cell module in which the above fixing member is used.

A further object of the present invention is to provide an execution method for installing a solar cell module using the above fixing member.

A further object of the present invention is to provide a fixing member for fixing a solar cell module or a roofing member with no solar cell onto a face for a roof to be installed, said fixing member having a meshing portion to mesh at least a solar cell module or a part of a roofing member with no solar cell, a fixing portion to fix said fixing member to a roof installation face, and a raised portion to connect said meshing portion and said fixing portion, wherein said raised portion has a height which is greater than the thickness of a portion of said solar cell module or said roofing member which is engaged in the meshing by said meshing portion.

A further object of the present invention is to provide a solar cell module array in which a solar cell module string comprising a plurality of solar cell modules and a roofing member are fixed on an installation face using the above fixing member, wherein the solar cell modules are electrically connected with each other.

A further object of the present invention is to provide an execution method comprising the steps of: arranging an electrically conductive communicating member on at least a part of an installation face for a solar cell module string, said part being situated under said solar cell module string to be installed, said solar cell module string comprising a plurality of solar cell modules; fixing at least a part of an exterior conductive portion of said solar cell module string by the above fixing member; fixing the fixing member so that the fixing member is directly contacted with said electrically conductive communicating member or the fixing member is electrically connected with said electrically conductive communicating member through an electrically conductive jointing material to fix the fixing member onto a support; and electrically connecting the solar cell modules with each other.

BRIEF DESCRIPTION OF THE DRAWINGS

FIG. 11 is a schematic cross-sectional view illustrating a roof on which a solar cell module is installed in Example 1 of the present invention which will be described later.

FIGS. 14A to 14C are schematic views illustrating a fixing member in Example 3 of the present invention which will be described later.

FIG. 15 is a schematic cross-sectional view illustrating a roof on which a solar cell module is installed in Example 3 of the present invention which will be described later.

FIG. 22 is a schematic cross-sectional view illustrating a roof on which a solar cell module is installed in Example 6 of the present invention which will be described later.

FIG. 25 is a schematic cross-sectional view illustrating a roof on which a solar cell module is installed in Example 8 of the present invention which will be described later.

FIGS. 26A to 26D are schematic views illustrating a fixing member in Example 9 of the present invention which will be described later.

DETAILED DESCRIPTION OF THE INVENTION AND PREFERRED EMBODIMENTS

Figure 1:
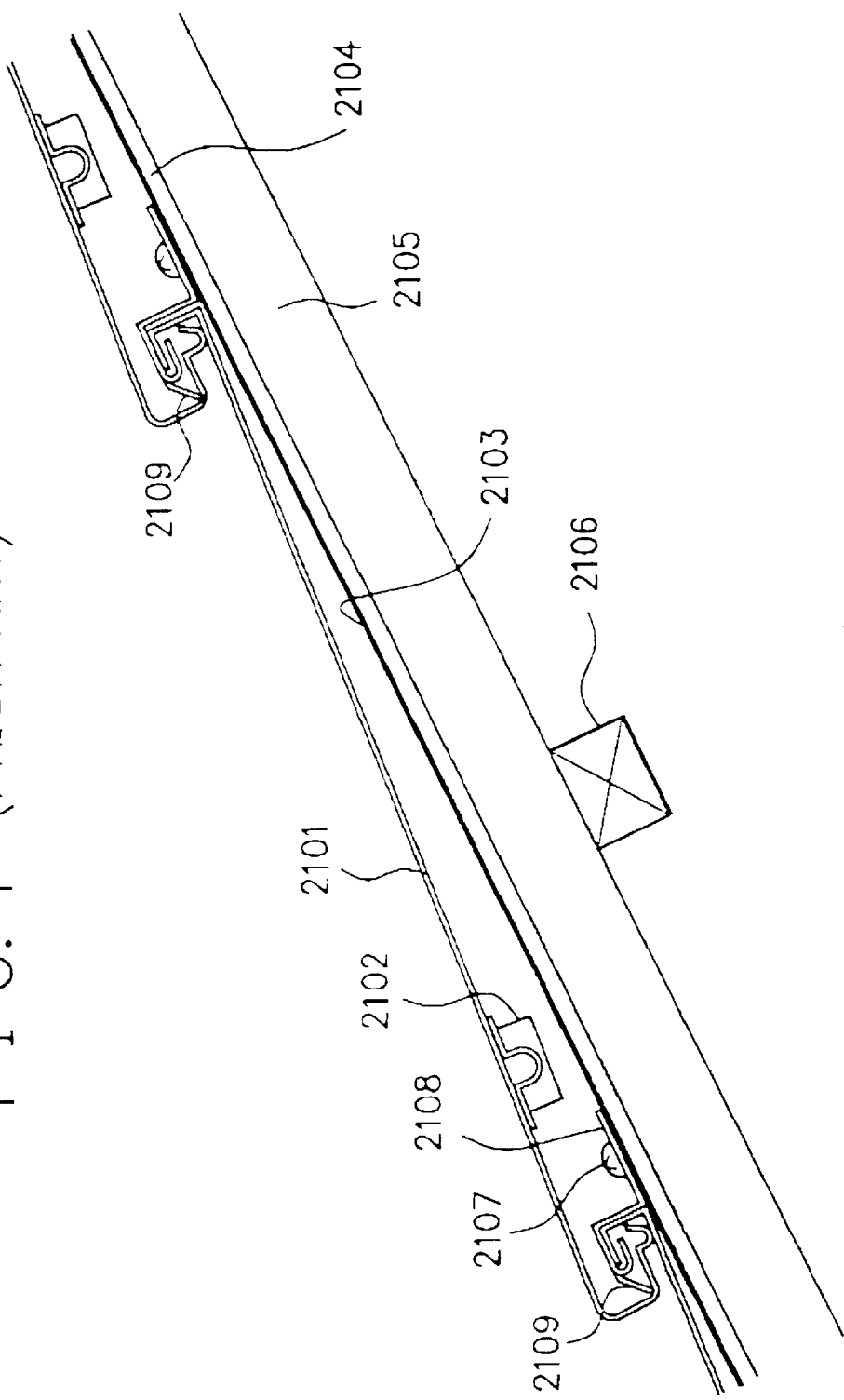
FIG. 1 is a schematic cross-sectional view illustrating an example of a conventional solar cell module-bearing roof.
Figure 2:
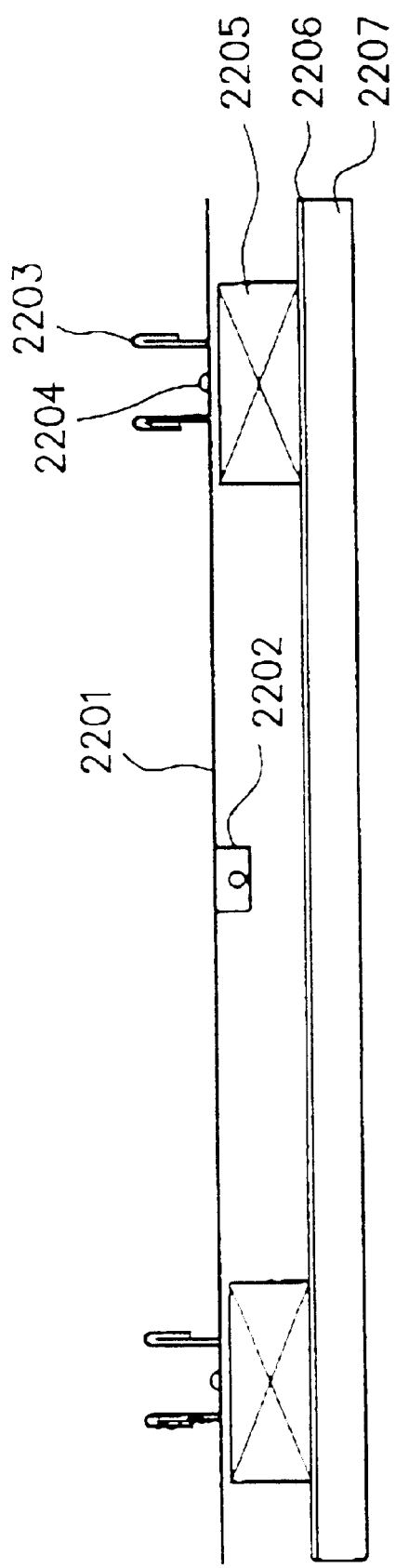
FIG. 2 is a schematic cross-sectional view illustrating another example of a conventional solar cell module-bearing roof.
Figure 3:
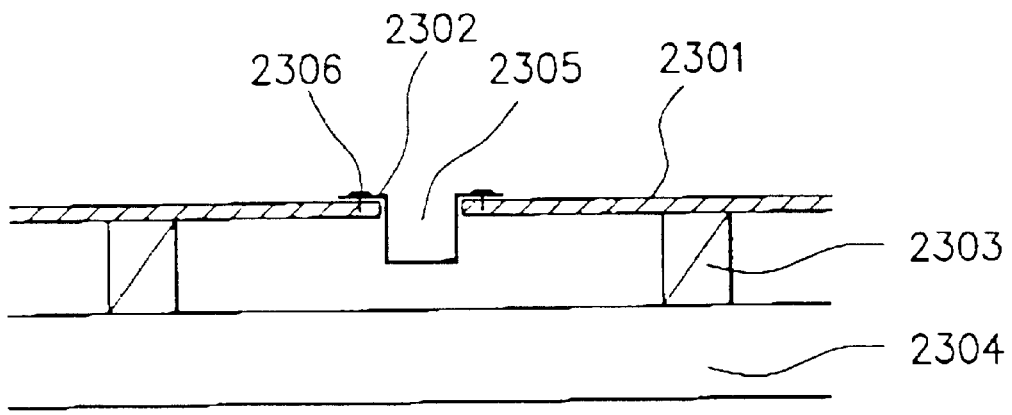
FIG. 3 is a schematic cross-sectional view illustrating an example of a conventional sheathing roof board.
Figure 4:
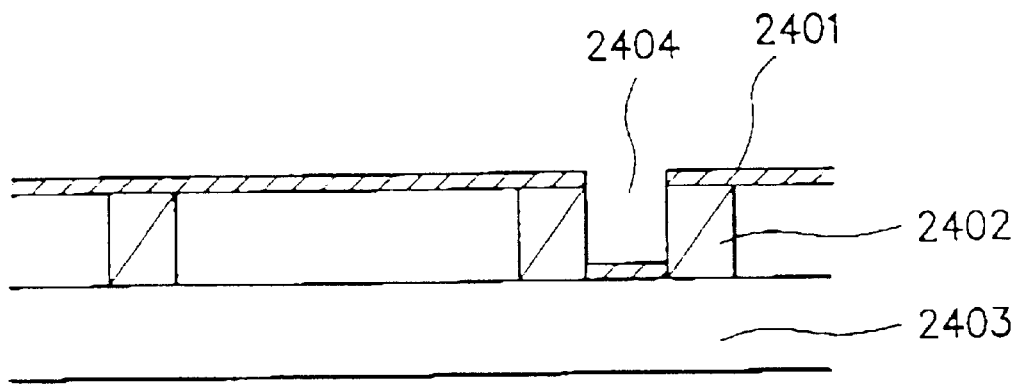
FIG. 4 is a schematic cross-sectional view illustrating another example of a conventional sheathing roof board.
Figure 5:
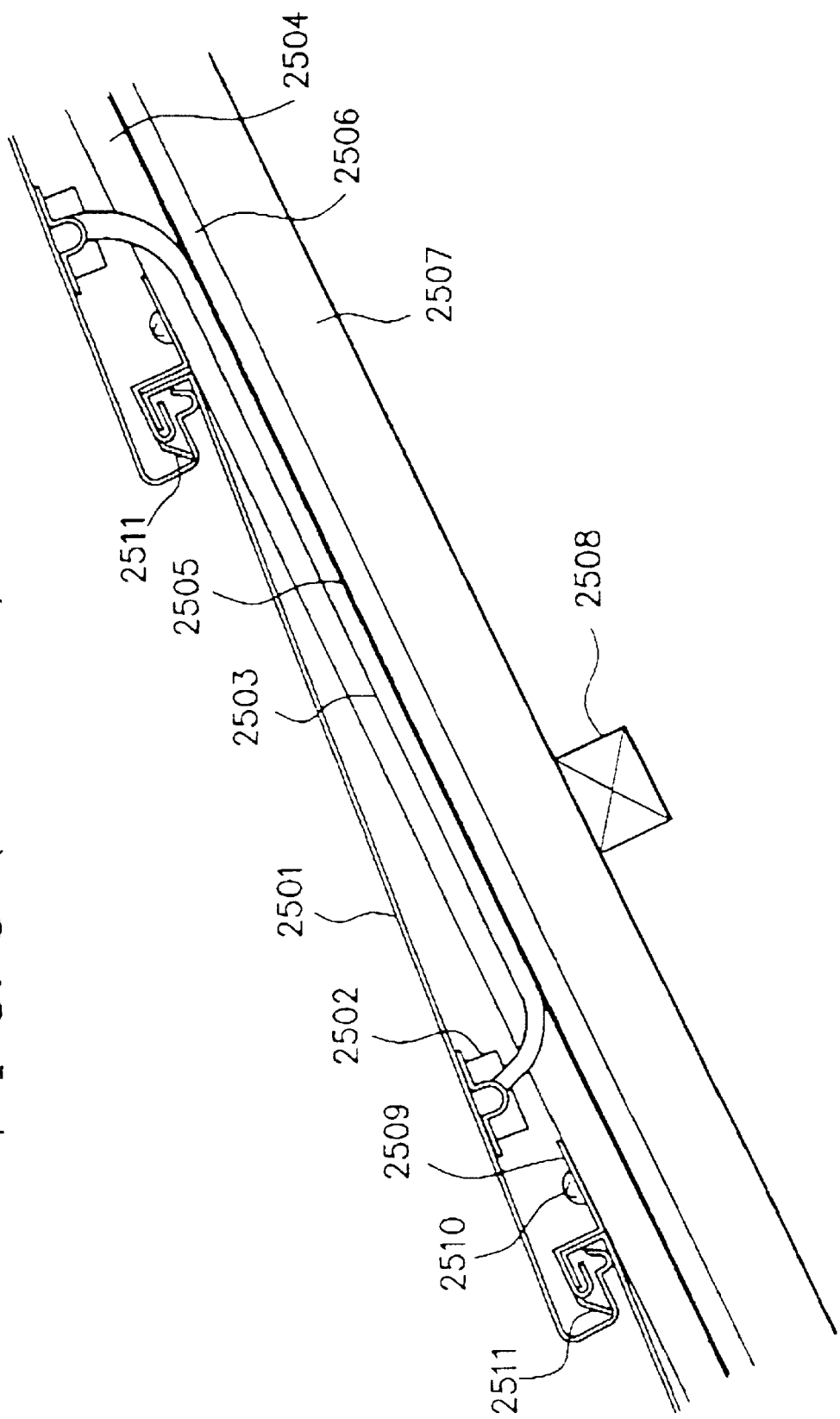
FIG. 5 is a schematic cross-sectional view illustrating a further example of a conventional solar cell module-bearing roof.
Figure 6:
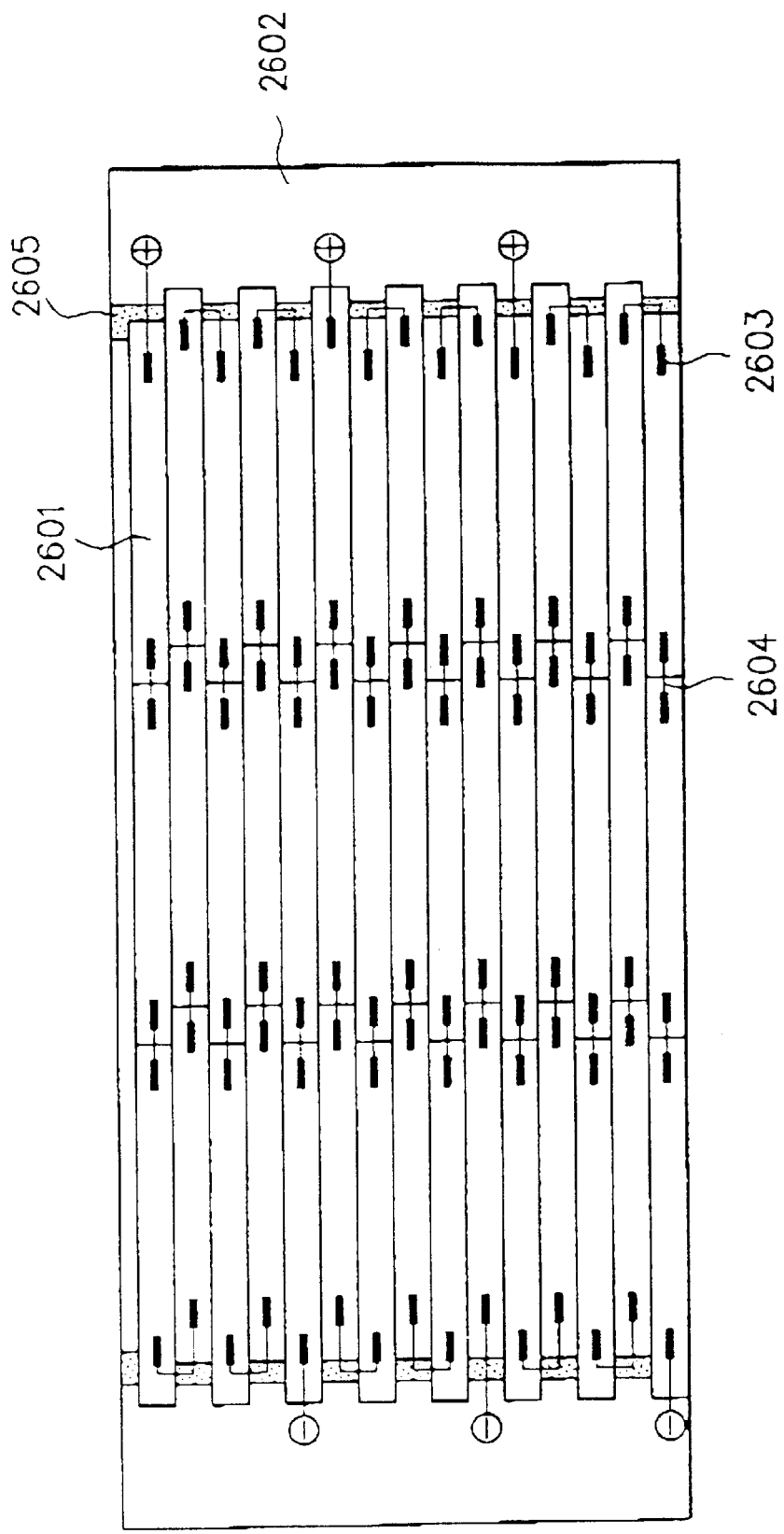
FIG. 6 is a schematic view illustrating a wiring embodiment of solar cell modules installed on a gable roof in the prior art.
Figure 7:
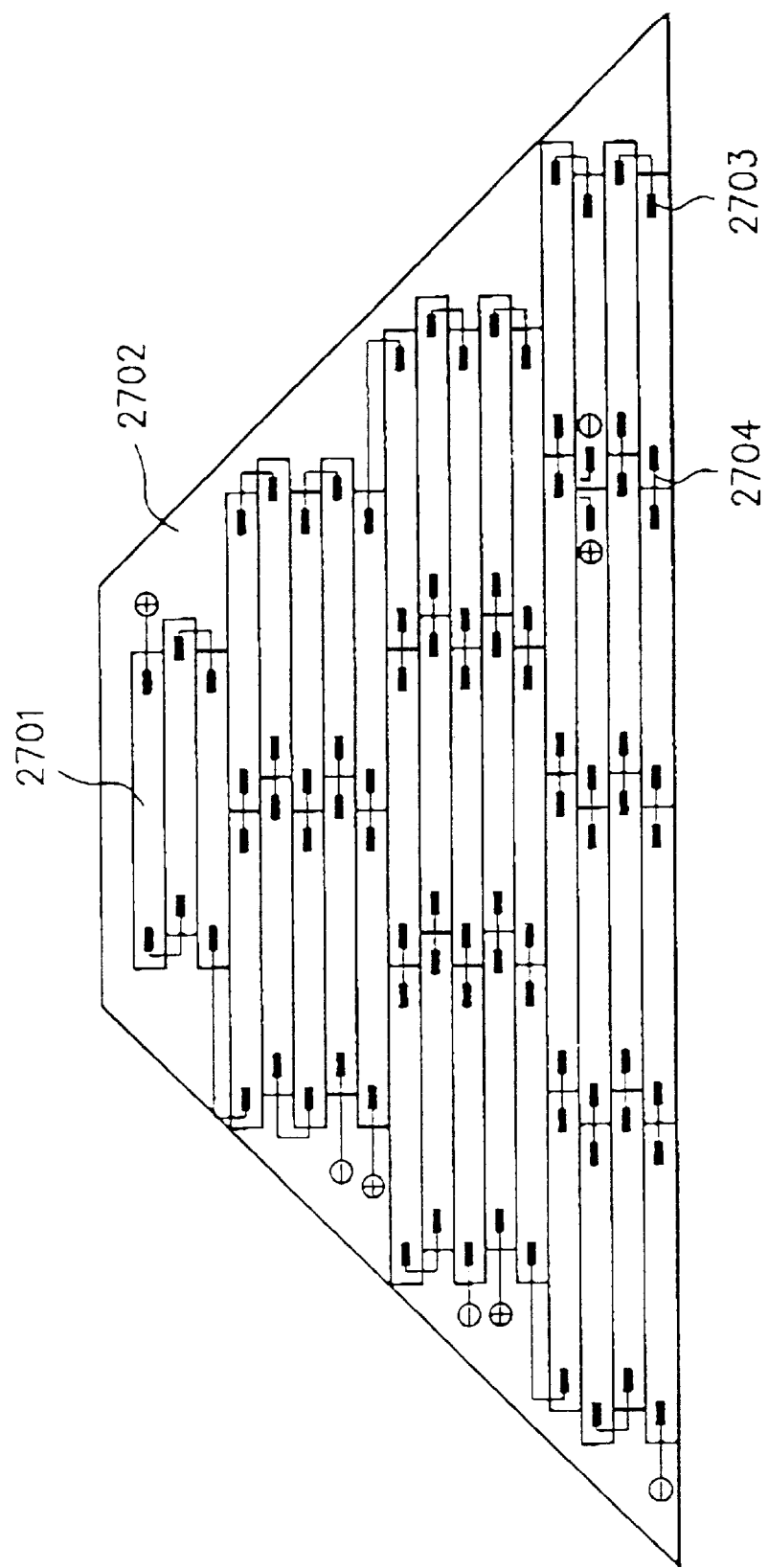
FIG. 7 is a schematic view illustrating a wiring embodiment of solar cell modules installed on a hip roof in the prior art.

The present invention is to eliminate the foregoing problems found in the prior art and to attain the above-described objects.

A principal feature of the present invention lies in a fixing member which enables one to desirably install a solar cell module with a diminished number of execution steps and at a low installation cost and which enables one to establish a space which allows a connection cable extending from said solar cell module to pass through.

As previously described, a typical embodiment of the fixing member according to the present invention comprises a meshing portion to mesh at least a solar cell module or a part of a roofing member with no solar cell; a fixing portion to fix said fixing member to a roof installation face; and a raised portion for connecting said meshing portion and said fixing portion, wherein said raised portion has a height which is greater than the thickness of a portion of said solar cell module or said roofing member which is engaged in the meshing by said meshing portion.

The fixing member according to the present invention is desirably configured as will be described below.

(1) The fixing member is designed to have a holding portion for holding the solar cell module or an end portion of the roofing member with no solar cell.

(2) The distance between the fixing portion and the holding portion of the fixing member is made to be greater than the outer diameter of a connection cable which is extended from the solar cell module.

(3) The distance between the fixing portion and the holding portion of the fixing member is made to be greater than the height of a junction box connected to the solar cell module.

(4) The holding portion of the fixing member is designed such that the tip of the holding portion in contact with the solar cell module does not reach the position where solar cells are situated on the light receiving face side of the solar cell module.

(5) The fixing member is formed of an electrically conductive material so that the fixing member exhibits an electric potential which is the same as that of the solar cell module or the roofing member when the fixing member contacts an outer conductive portion of the solar cell module or the roofing member.

By configuring the fixing member as above described, there are provided such significant advantages as will be described below.

(i) When the solar cell module or the roofing member is fixed by the fixing member, a space is formed between the solar cell module and the sheathing. When the space has a height which is greater than the outer diameter of the connection cable extended from the solar cell module, cable connection can be desirably conducted in the space without using a raising member comprising a spacer or the like.

In addition, when the height of the space is greater than the height of a junction box for the solar cell module, the junction box can be accommodated in the space.

(ii) Because the fixing member is provided with the holding portion to retain an end portion of the solar cell module or an end portion of the roofing member, the opposite end portions of the solar cell module are firmly fixed. Thus, the solar cell module or the roofing member is made to have sufficient mechanical strength against flexure and vibration.

(iii) Because the tip of the holding portion of the fixing member in contact with the solar cell module does not reach the position where the solar cells are situated on the light receiving face side of the solar cell module, the stress of the tip portion exerts no effect on the solar cells in the solar cell module.

(iv) The fixing member is formed of an electrically conductive material so that the fixing member exhibits an electric potential which is the same as that of the solar cell module or the roofing member when the fixing member contacts an outer conductive portion of the solar cell module or the roofing member. As a result, roofing execution work and earthing execution work can be conducted at the same time. At the same time, by fixing the fixing member to an electrically conductive communicating member which has been previously laid, the solar cell module or the roofing member can be electrically grounded.

The above situation desirably diminishes the execution costs and the number of execution steps.

In the following, preferred embodiments of the present invention will be described. The scope of the present invention is restricted to these embodiments, and these embodiments can be modified within a range in which the object of the present invention is attained.

Fixing Member

The fixing member has the meshing portion to mesh an end portion of a solar cell module and an end portion of a roofing member having a form which is substantially the same as that of said solar cell module and the fixing portion to fix the fixing member to a substrate.

In a preferred embodiment, the meshing portion is shaped in a hook-like form. However, the meshing portion may be shaped in other appropriate forms such as an L-letter form, a crank form or a curved form as long as it can mesh with a part of a solar cell module to thereby fix the solar cell module.

The fixing portion is generally shaped in a plane form and is provided with an underhole for fixing to the substrate. However, this is not limitative.

Fixing the fixing member to the substrate may be accomplished by means of a bolt, a tapping screw, a self-drilling tapping screw, a nail, a rivet, or welding.

When the fixing member has the holding portion for holding the solar cell module or an end portion of the roofing member, the holding portion may be formed such that it is integrated with the fixing member. Alternatively, it may comprise a member which is different from the fixing member.

In the case where earthing is conducted through the fixing member, the fixing member is required to be constituted by an electrically conductive material. Specific examples of such electrically conductive material are Fe, steel, galvanized steel, stainless steel, aluminum-zinc alloy plated steel, Al, Cu, tinned steel, Ag, and Au.

Solar Cell Module
Solar Cell (Photovoltaic Element)

A solar cell (the photovoltaic element) used in a solar cell module used in the present invention may be a crystalline silicon solar cell, an amorphous silicon solar cell, or a compound semiconductor solar cell. In any case, the solar cell may comprise a photoelectric conversion semiconductor layer formed on a metal substrate, a glass substrate, a synthetic resin substrate, or a crystalline silicon film.

Solar Cell Module

A solar cell module and a module with no solar cell (hereinafter referred to as solar cell-free module) having an electrically conductive periphery and which is arranged next to said solar cell module may be of a configuration having an aluminum frame or a protective glass member. Also, the solar cell module may be of a flexible configuration comprising a solar cell (a photovoltaic element) protected by a resin layer without having the aluminum frame or the protective glass member.

The solar cell module and the solar cell-free module may be configured such that their rear sides are reinforced and supported by a metal plate.

Particularly, in the case of a roof-integral type solar cell module having a surface protective member comprising a light transmissive resin film and a back face reinforcing member comprising a metal steel member, it can be processed in a form similar to that of a metal roof. For instance, it can be formed in a stepping roof form, a ribbed seam roof form, or a folding plate-like form.

Junction Box

The solar cell module has a pair of power output terminals, i.e., a positive power output terminal and a negative power output terminal which serve to output a direct current power generated by the solar cell module. In order to accommodate these power output terminals, a pair of junction boxes are provided for the solar cell module. In addition, there are provided a pair of connection cables. An end portion of each connection cable is electrically connected to the corresponding power output terminal through the junction box. The two connection cables are extended to the outside, where they are electrically connected to an inverter for converting the direct current power into an alternating current power.

The junction box is required to excel in heat resistance, moisture resistance, waterproofness, electrically insulating properties, cold resistance, oil resistance, weatherability, and mechanical strength. In addition, the junction box is desirably good in adhesion with an adhesive.

The junction box is desirably constituted by a material which satisfies these requirements, such as plastics. When flame resistance is additionally taken into consideration, the junction box is desirably constituted by an incombustible plastic or ceramics.

Such plastic can include, for example, polycarbonate, polyamide, polyacetal, modified PPO (PPE), polyester, polyarylate, unsaturated polyester, phenol resin, and engineering plastic. Besides, thermoplastic plastics such as ABS resin, PP, and PVC are also usable.

In order to improve the resistance to ultraviolet rays, a pigment comprising carbon black can be used or the surface of the junction box can be coated by a resin coating material having a property of absorbing ultraviolet rays.

Connection Cable

There is no particular limitation for the connection cable used in the present invention. However, the connection cable is preferred to have a cable structure. In any case, the connection cable is required to endure environments under which the solar cell module is situated. Hence, the connection cable is required to have heat resistance, cold resistance, oil resistance, weatherability, moisture resistance, waterproofness and flame resistance. Specific examples of such connection cable are insulated wires of IV, KIV, HKIV, crosslinked polyethylene, fluororubber, silicone rubber, or fluororesin, and cables of VV, CV, CE, EE, or cabtire.

General Building Material

In the case where a solar cell module and a solar cell-free module to be arranged next to said solar cell module are arranged on a roof or a wall of a building, an appropriate building material can be arranged on an area other than the area on which the solar cell module and the solar-cell free module are arranged so as to be situated next to the solar cell module or the solar-cell free module.

Such building material can include tile, metallic building member, slate, asphalt shingle, and the like.

Electrically Conductive Communicating Member

In the case where the fixing member is fixed on an insulating material, it is desirable to dispose an electrically conductive communicating member between the fixing member and the insulating material so that the fixing member is electrically connected with the electrically conductive communicating member. By this, in the work of fixing the fixing member, the fixing member is made to have electrical continuity with the electrically conductive communicating member. The electrically conductive communicating member may be shaped in a plate form, a linear form or a belt form.

The electrically conductive communicating member may comprise a metallic underlayment comprising a coated galvanized steel sheet.

Also, the electrically conductive communicating member may be a member having any of the foregoing forms and which comprises a metal selected from the group consisting of Fe, Cu, Ag, Al, and Ti; or an alloy selected from the group consisting of alloys of these metals including steels such as stainless steel. Other than these, various plated steels are also usable.

Installation Face

In the case where the installation face on which a solar cell module and a solar cell-free module to be arranged next to said solar cell module are arranged is a roof face of a building, the roof face generally has a sheathing roof board and a waterproof roofing member which are laid thereon. In the case where the installation face is a face of a roof or a wall of a large building, the face contains a metallic structural member integrated therein, where the solar cell module and the solar cell-free module are arranged and fixed on such face such that the solar cell-free module is situated next to the solar cell module. In the case where the installation face is a surface of the ground, an installation table having a steel-framed structure is placed on the ground surface, and the solar cell module and the solar cell-free module are installed on the installation table such that the solar cell-free module is situated next to the solar cell module. Also, in the case where the installation face is a surface of a carport or a structural material previously provided, an appropriate installation table is placed thereon, and the solar cell module and the solar cell-free module are installed thereon.

Of these installation faces, the roof face having the sheathing roof board and the waterproof roofing member which are laid thereon is the most preferred for using the fixing member according to the present invention in order to arrange and fix the solar cell module and the solar cell-free module.

In the following, the features and advantages of the present invention will be described in more detail with reference to examples. It should be understood that these examples are only for illustrative purposes and the scope of the present invention is not restricted to these examples.

EXAMPLE 1

In this example, a solar cell module array was established by fixing a flexible roofing member integral type solar cell module processed in a stepping roofing member form to a sheathing face of a roof using a fixing member according to the present invention and connecting connection cables to the solar cell module. In this example, prior to installing the solar cell module, an electrically conductive communicating member was previously laid on the sheathing face, and a fixing member according to the present invention was fixed to the electrically conductive communicating member, whereby earthing was conducted.

In the following, detailed description will be made of the solar cell module array in this example.

Fixing Member

Figure 8A:
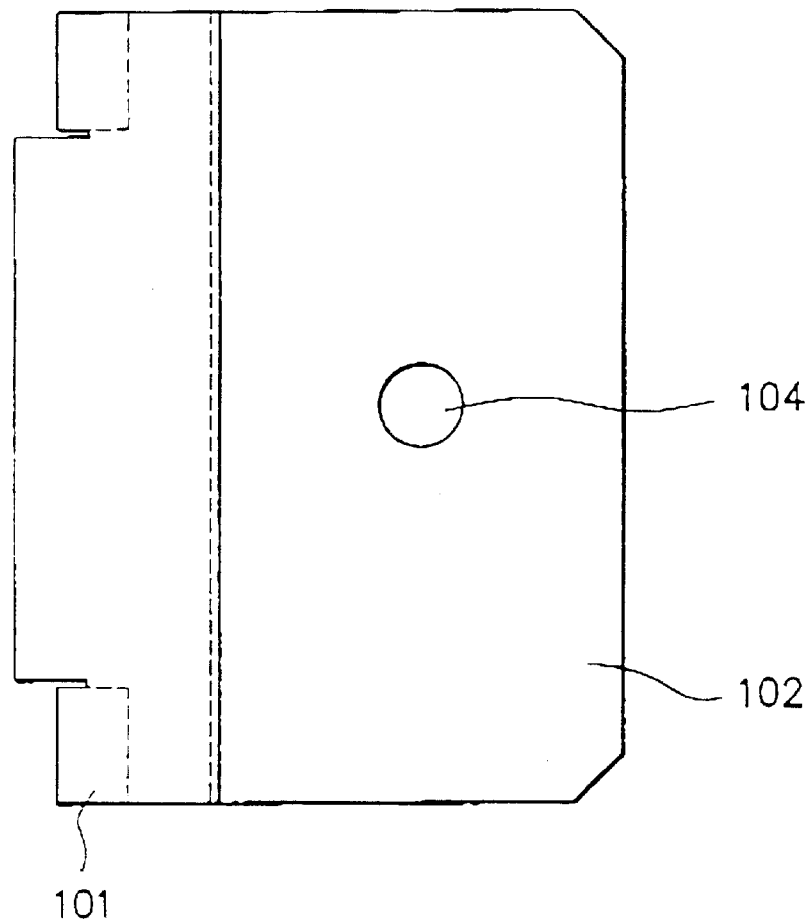
FIGS. 8A and 8B are schematic views illustrating a fixing member in Example 1 of the present invention which will be described later.
Figure 8B:
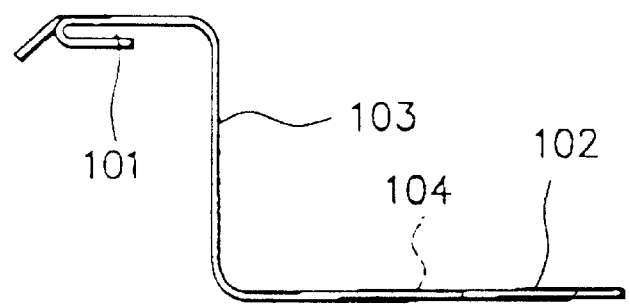

As the fixing member, there was used a fixing member having such configuration as shown in FIGS. 8A and 8B. FIG. 8A is a schematic plan view and FIG. 8B is a schematic elevation view. In FIGS. 8A and 8B, reference numeral 101 indicates a meshing portion where a lower seam portion of a solar cell module on the ridge side is meshed with the meshing portion while being inserted therein. Reference numeral 102 indicates a fixing portion which is contacted to a supporting member as a backing, reference numeral 103 a raised portion of connecting the fixing portion 102 and the meshing portion 101, and reference numeral 104 an under-hole into which a tapping screw is inserted to fix the fixing portion 102 to a sheathing.

A galvanized steel plate having a thickness of 1 mm was cut to obtain a member having a width of 70 mm and a length of 80 mm. The member thus obtained was processed with the use of a press molding machine to form a basic form for the above fixing member. Here, the height of the raised portion 103 is 22 mm.

Solar Cell Module

Figure 9:
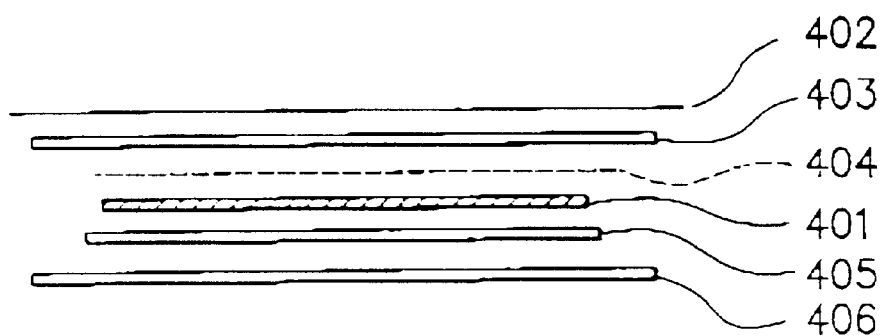
FIG. 9 is a schematic view illustrating the constitution of an example of a solar cell module which can be used in the present invention.

On the surface of a stainless steel substrate having a thickness of 0.1 mm, a plurality of amorphous solar cells (photovoltaic elements) manufactured by a conventional manner using plasma CVD is provided. The amorphous silicon solar cells formed on the stainless steel substrate were electrically connected with each other in series connection to obtain a string comprising the plurality of solar cells integrated. The string was sealed to obtain a flexible amorphous silicon solar cell module having such constitution as shown in FIG. 9.

In the following, description will be made of the manner of preparing this solar cell module with reference to FIG. 9.

On a back face reinforcing member 406, there were sequentially laminated a multi-layered back side film 405, the foregoing solar cell string 401, a surface side protective and reinforcing member 404, a surface side sealing member 403, and a light transmissive surface protective member 402, whereby a stacked body was obtained. The stacked body was subjected to thermocompression bonding treatment at 160° C. using a vacuum laminator, whereby the surface side sealing member 403 was heat-fused and crosslinked. In this way, there was prepared a flexible amorphous silicon solar cell module.

In the following, description will be made of the members used in the preparation of the solar cell module.

As the surface side protective and reinforcing member 404, there was used a nonwoven glass fabric having a density of 40 g/m$^2$, a thickness of 200 $\mu$m, an adhesive acrylic resin content of 4.0%, a line diameter of 10 $\mu$m, and a fiber length of 13 mm.

As the light transmissive surface protective member 402, there was used a non-oriented ETFE (ethylene-tetrafluoroethylene) film having a thickness of 50 $\mu$m. This film has a coefficient of extension of more than 250%. At the time of the vacuum lamination, an embossed sheet was laminated on this ETFE film in order to provide irregularities at the light receiving face.

As the surface side sealing member 403, there was used a 460 $\mu$m thick EVA (ethylene-vinyl acetate copolymer) film obtained from a mixture comprising EVA, a crosslinking agent, a UV absorber, an antioxidant, and a photostabilizer.

As the multi-layered back side film 405, there was used a three-layered film comprising a 225 $\mu$m thick EVA film as an adhesive layer, a 100 $\mu$m thick PET (polyethylene terephthalate) film as an insulating layer and a 225 $\mu$m thick EVA film as an adhesive layer stacked in this order.

As the back face reinforcing member 406, there was used a 0.4 mm thick galvanizing-alloy coated steel plate.

The flexible amorphous silicon solar cell module thus obtained was processed using a roll forming machine, whereby the flexible amorphous silicon solar cell module was shaped into a stepping roofing solar cell module form.

Figure 10A:
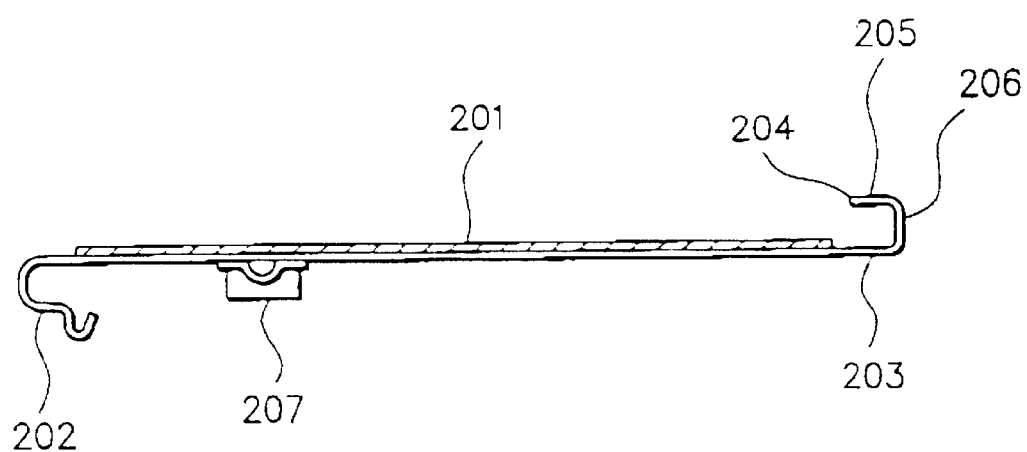
FIGS. 10A and 10B are schematic views illustrating the constitution of a roof integral type solar cell module used in Example 1 of the present invention which will be described later.
Figure 10B:
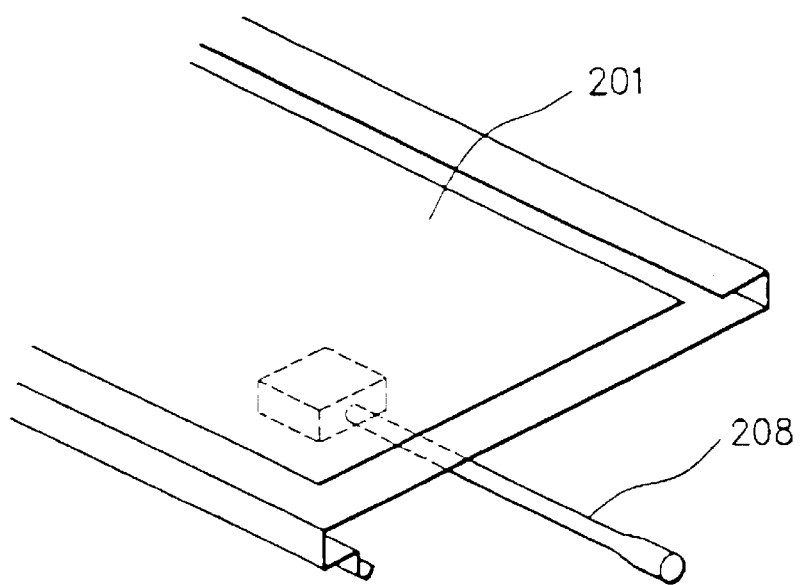

FIGS. 10A and 10B are schematic views illustrating the form of the above stepping roofing solar cell module. FIG. 10A is a schematic cross-sectional view of the solar cell module, and FIG. 10B is a schematic slant view of a side end portion of the solar cell module.

In FIGS. 10A and 10B, reference numeral 201 indicates a solar cell string, reference numeral 202 an upper seam, reference numeral 203 a ridge side lower end portion, reference numeral 204 an end portion of a lower seam, reference numeral 205 an upper portion of the lower seam, and reference numeral 206 a raised portion of the lower seam.

At the rear face of the solar cell module, there is provided a pair of junction boxes 207 made of polycarbonate, one for a positive power output terminal extended from the solar cell string and the other for a negative power output terminal extended from the solar cell string. From each junction box, a power output connection cable 208 is extended to the outside. Here, the junction box 207 has a height of 13.4 mm, and the outer diameter of the connection cable 208 is 6.4 mm.

Constitution of Roof Face

FIG. 11 is a schematic cross-sectional view of a roof, viewed from the main frame direction, when a solar cell module is installed on a roof face. In FIG. 11, reference numeral 301 indicates a sheathing roof board. In this example, a plywood having a thickness of 12 mm was used as the sheathing roof board. Reference numeral 302 indicates a waterproof roofing member. In this example, an asphalt-impregnated type 22 Kg member was used as the waterproof roofing member.

On the waterproof roofing member 302, at least a linear-shaped electrically conductive communicating member 303 (this will be described later) was laid so as to pass under the solar cell module 304. Here, although not being detailed in FIG. 11, as the solar cell module 304, there were provided a plurality of flexible amorphous silicon solar cell modules prepared in the foregoing manner, and they were sequentially arranged from the eaves side to form a plurality of stage groups each comprising a plurality of solar cell modules arranged while being electrically connected with each other on the roof face.

Particularly, after the solar cell module 304 was arranged, the solar cell module was fixed onto the sheathing roof board 301 and to the electrically conductive communicating member 303 using the fixing member 305 having the configuration shown in FIGS. 8A and 8B and a drilling tapping screw 306 (applied with UNICHRO treatment (electrogalvanizing and bright chromate treatment) developed by United Chromium Company, M4×30 mm). In this example, four fixing members having the configuration shown in FIGS. 8A and 8B were used in order to fix each solar cell module.

In FIG. 11, reference numeral 307 indicates a junction box, reference numeral 308 a connection cable, reference numeral 309 a rafter, and reference numeral 310 a main frame.

In this example, the lower seam tip (corresponding to the portion shown by reference numeral 204 in FIG. 10A) of the solar cell module which is meshed with the meshing portion (corresponding the portion shown by reference numeral 105 in FIG. 8B) of the fixing member 305 is contacted with the tip of the meshing portion of the fixing member, whereby earthing for the solar cell module and the fixing member can be attained.

After completing the installation execution work for the solar cell modules of a first stage group in the manner as above described, the last solar cell module of the first stage group was electrically connected to an initial solar cell module of a second stage group by means of a connection cable and the solar cell modules of the second stage group were installed. In this way, the solar cell modules of successive stage groups were installed.

Finally, on the electrically conductive communicating member situated in the vicinity of a wire-uptaking hole provided in the vicinity of the ridge, an earthing line of 5.5 mm$^2$ having a crimp-style terminal was fixed by means of a hexagonal self-drilling tapping screw having a flange, followed by drawing into the indoor through an opening provided at the roof face together with the cables extending from the solar cell modules of all the stage groups and the earthing line was electrically connected to a class 3 earth.

As the electrically conductive communicating member 303 used in the above, a strip member having a width of 100 mm and a length of 1820 mm obtained by processing a non-coated hot-dip galvanized steel plate having a thickness of 0.5 mm and a size of 1820 mm×941 mm and having a plated zinc quantity of 1800 g/m$^2$ (Z 18) using cutting equipment was used. Because the strip member was deficient in length to traverse the roof face, a strip member newly prepared in the foregoing manner was added to the previous strip member. In the addition in this case, the overlapped portion of the two string members was made to be more than 100 mm×100 mm, and the overlapped portion was fixed using drill vises so as to ensure their electrical continuity.

Now, by using the solar cell module-fixing members as above described, a space is established between the ridge side lower end portion of the solar cell module and the sheathing as shown in FIG. 11. As a result, without requiring lifting means such as a spacer to lift the solar cell module, electrical connection of the solar cell modules in a water flow direction can be readily conducted through the space.

Further, by fixing the solar cell module by means of the fixing members as above described, earthing for the solar cell module can be conducted at the same time. Therefore, it is not necessary to separately conduct the execution work for the solar cell modules and the earthing work. This situation diminishes the execution costs.

Evaluation of Earthing

In order to confirm the reliability of the continuity of the above earthing, there were prepared three small samples (Sample No. 1 to Sample No.3) having a configuration which is the same as that in the above where the solar cell modules were arranged on the roof face. For each of these samples, the initial electric resistance of its backing plate and electrically conductive communicating member was measured by way of a conventional four terminal method. Then, each sample was introduced into a combined cycle tester (produced by Suga Shikenki Kabushiki Kaisha), wherein the sample was subjected to an environmental test based on JASO-M-609-91 by repeatedly conducting a cycle comprising (a) spraying salt water (50° C., 98% RH) for 2 hours, (b) drying (60° C., 30% RH) for 4 hours, and (c) wetting (50° C., 95% RH) for 2 hours 45 times. After this, the electric resistance of the backing plate and electrically conductive communicating member was measured by way of the conventional four terminal method.

The measured results are collectively shown in Table 1. From the results shown in Table 1, it is understood that the continuity of the earthing in this example is satisfactory.

EXAMPLE 2

In this example, a solar cell module array was established by fixing a flexible roofing member integral type solar cell module processed in a stepping roofing member form to a sheathing face of a roof using a fixing member according to the present invention and connecting connection cables to the solar cell module. In this example, prior to installing the solar cell module, an electrically conductive communicating member was previously laid on the sheathing face, and the fixing member was fixed to the electrically conductive communicating member, whereby earthing was conducted.

In the following, detailed description will be made of the solar cell module array in this example.

Fixing Member

Figure 12A:
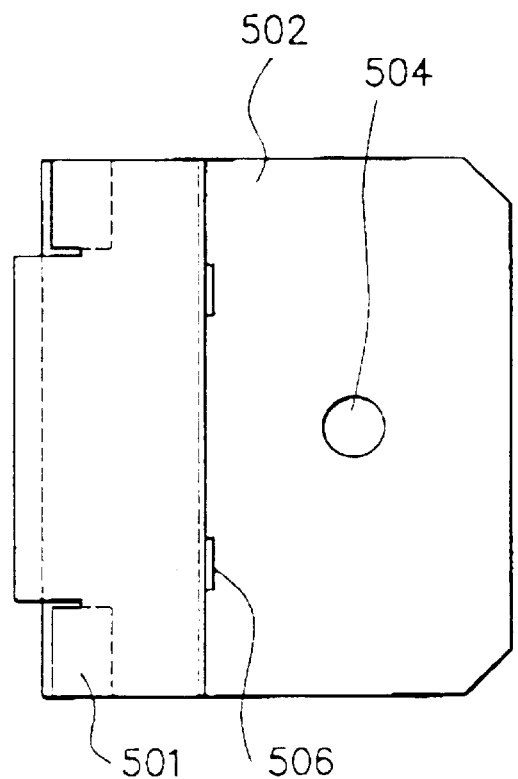
FIGS. 12A to 12C are schematic views illustrating a fixing member in Example 2 of the present invention which will be described later.
Figure 12C:
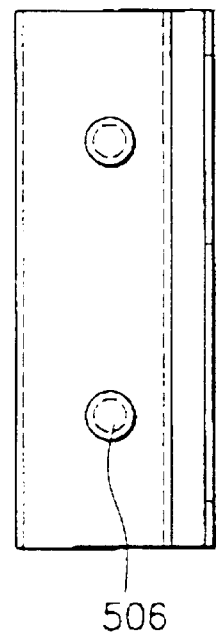
Figure 12B:
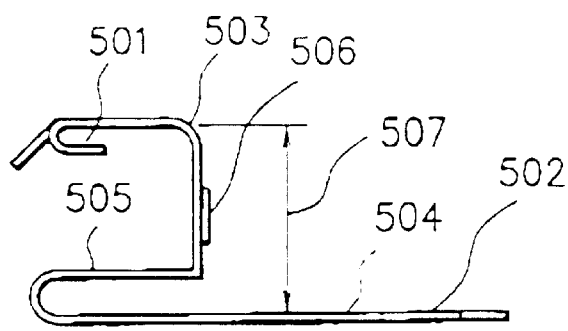

As the fixing member, there was used a fixing member having such configuration as shown in FIGS. 12A to 12C. FIG. 12A is a schematic plan view, FIG. 12B is a schematic elevation view, and FIG. 12C is a schematic side view. In FIGS. 12A to 12C, reference numeral 501 indicates a meshing portion where a lower seam end portion of a solar cell module on the ridge side is meshed with the meshing portion while being inserted therein. Reference numeral 502 indicates a fixing portion which is contacted to a supporting member as a backing, reference numeral 503 a raised portion for connecting the fixing portion 502 and the meshing portion 501, and reference numeral 504 an underhole into which a drilling tapping screw is inserted to fix the fixing portion 502 to a sheathing. Reference numeral 505 indicates a holding portion for retaining a ridge side lower end portion of the solar cell module. The raised portion 503 is provided with two screw holes 506 of M4 for earthing, having been applied with burring treatment.

The fixing member was prepared as will be described below.

A galvanized steel plate having a thickness of 0.6 mm was cut to obtain a member having a width of 70 mm and a length of 115 mm. The member thus obtained was processed by subjecting to press-molding and folding to form a basic form of the above fixing member. Here, the height 507 of the raised portion 503 (the distance from the meshing portion to the fixing portion) is 24 mm.

The raised portion 503 of the basic form of the fixing member was subjected to folding processing to have a holding portion 505 for retaining a ridge side lower end portion of the solar cell module. Thereafter, two holes (506) were formed at the raised portion 503, and the two holes were subjected to burring treatment, followed by subjecting screw cutting to convert the two holes into screw holes 506 of M4.

For each of the screw holes 506, a tapping vise with a class 3 groove was meshed. In the installation work, the tapping vise is fastened with a torque of 4.6 kgf/cm, whereby the tapping vise chips the coating face of the backing plate constituting the raised lower seam of the solar cell module to surely contact the metal constituent of the backing plate, whereby electric continuity between the backing plate and the fixing member is attained.

Solar Cell Module

In this example, there were used a plurality of flexible amorphous silicon solar cell modules prepared in the same manner as in Example 1.

Constitution of Roof Face

Figure 13:
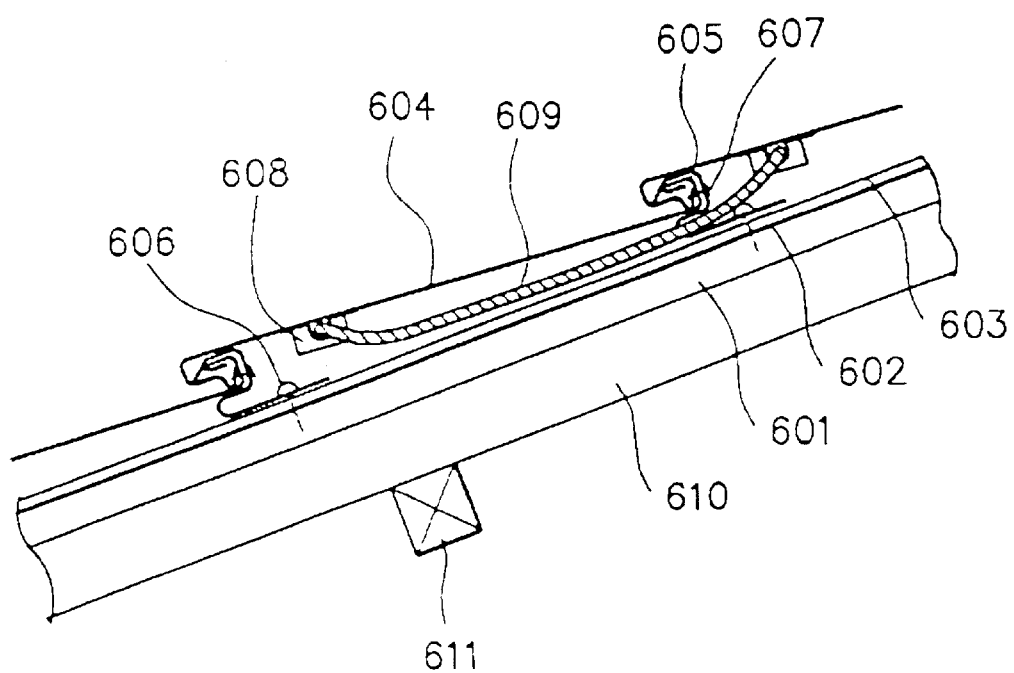
FIG. 13 is a schematic cross-sectional view illustrating a roof on which a solar cell module is installed in Example 2 of the present invention which will be described later.

FIG. 13 is a schematic cross-sectional view of a roof, viewed from the main frame direction, when a solar cell module is installed on a roof face. In FIG. 13, reference numeral 601 indicates a sheathing roof board. In this example, a plywood having a thickness of 12 mm was used as the sheathing roof board. Reference numeral 602 indicates a waterproof roofing member. In this example, an asphalt-impregnated type 22 Kg member was used as the waterproof roofing member.

On the waterproof roofing member 602, at least an electrically conductive communicating member 603 (this will be described later) was laid so as to pass under the solar cell module 604.

Although not detailed in FIG. 13, a plurality of solar cell modules provided in the above were sequentially arranged from the eaves side to form a plurality of stage groups, each comprising a plurality of solar cell modules arranged while being electrically connected with each other on the roof face.

Particularly, after the solar cell module 604 was arranged, the solar cell module was fixed onto the sheathing roof board 601 and to the electrically conductive communicating member 603 using the fixing member 605 having the configuration shown in FIGS. 12A to 12C and a drilling tapping screw 606 (applied with UNICHRO treatment, M4×30 mm). In this example, four fixing members having the configuration shown in FIGS. 12A to 12C were used in order to fix each solar cell module.

In FIG. 13, reference numeral 607 indicates a tapping screw with a class 3 groove, reference numeral 608 a junction box, reference numeral 609 a connection cable, reference numeral 610 a rafter, and reference numeral 611 a main frame.

In this example, as above described, the four fixing members were used in order to fix one solar cell module. As one of the four fixing members, there was used a fixing member having the configuration shown in FIGS. 12A to 12C and having two screw holes 506 at the raised portion 503 as shown in FIG. 12C for the earthing purpose. As the remaining three fixing members, there were used three fixing members having the configuration shown in FIGS. 12A and 12B and having no screw holes 506 at their raised portion 503.

For the above earthing fixing member, the fixing portion 502 thereof was fixed to the electrically conductive communicating member 603. For each of the screw holes 506 of the fixing member, a tapping vise with a class 3 groove was meshed. In the installation work, the tapping vise was fastened with a torque of 4.6 kgf·cm, where the tapping vise chipped the coating face of the backing plate constituting the raised lower seam (206, see FIG. 10A) of the solar cell module to surely contact the metal constituent of the backing plate, whereby electric continuity between the backing plate and the fixing member was attained.

After completing the installation execution work for the solar cell modules of a first stage group in the manner as above described, the last solar cell module of the first stage group was electrically connected to an initial solar cell module of a second stage group by means of a connection cable, and the solar cell modules of the second stage group were installed. In this way, the solar cell modules of the successive stage groups were installed.

Finally, on the electrically conductive communicating member situated in the vicinity of a wire-uptaking hole provided in the vicinity of the ridge, an earthing line of 5.5 mm$^2$ having a crimp-style terminal was fixed by means of a hexagonal self-drilling tapping screw having a flange, followed by drawing into the indoor through an opening provided at the roof face together with the cables extending from the solar cell modules of all the stage groups. The earthing line was electrically connected to a class 3 earth.

As the electrically conductive communicating member 603 used in the above, a strip member having a width of 100 mm and a length of 1820 mm obtained by processing a non-coated hot-dipped galvanized steel plate having a thickness of 0.5 mm and a size of 1820 mm×941 mm and having a plated zinc quantity of 270 g/m$^2$ (Z 27) using cutting equipment was used. Because the strip member was deficient in length to traverse the roof face, a strip member newly prepared in the foregoing manner was added to the previous strip member. In the addition in this case, the overlapped portion of the two string members was made to be more than 100 mm×100 mm, and the overlapped portion was fixed using drill vises so as to ensure their electrical continuity.

In this example, by using the solar cell module-fixing members as above described, a space is established between the ridge side lower end portion of the solar cell module and the sheathing as shown in FIG. 13. As a result, without requiring a lifting means such as a spacer to lift the solar cell module, electrical connection of the solar cell modules in a water flow direction can be readily conducted through the space.

Also, because the fixing member has the holding portion to retain a ridge side end portion of the solar cell module as above described, the opposite end portions of the solar cell module in a water flow direction are firmly fixed, whereby the solar cell module is made to have satisfactory mechanical strength.

In addition, the holding portion of the fixing member is formed by way of folding treatment as above described. Thus, the formation thereof is simple, and the fixing member can be prepared at a reasonable production cost while reducing the material cost.

Further, by making the fixing member have a structure for earthing as above described, earthing for the solar cell module can be conducted at the same time as fixing the solar cell module. Therefore, it is not necessary to separately conduct the execution work for the solar cell modules and the earthing work. This diminishes the execution costs.

Evaluation of Earthing

In order to confirm the reliability of the continuity of the above earthing, there were prepared three small samples (Sample No.1 to Sample No. 3) having a configuration which is the same as that above where the solar cell modules were arranged on the roof face. For each of these samples, evaluation was conducted in the same manner as in Example 1.

The evaluated results are collectively shown in Table 2. From the results shown in Table 1, it is understood that the continuity of the earthing in this example is satisfactory.

EXAMPLE 3

In this example, a solar cell module array was established by fixing a flexible roofing member integral type solar cell module processed in a stepping roofing member form to a sheathing face of a roof using a fixing member according to the present invention and connecting connection cables to the solar cell module. In this example, prior to installing the solar cell module, an electrically conductive communicating member was previously laid on the sheathing face, and a fixing member according to the present invention was fixed to the electrically conductive communicating member, whereby earthing was conducted.

In the following, detailed description will be made of the solar cell module array in this example.

Fixing Member

As the fixing member, there was used a fixing member having such configuration as shown in FIGS. 14A to 14C. FIG. 14A is a schematic plan view, FIG. 14B is a schematic elevation view, and FIG. 14C is a schematic side view. In FIGS. 14A to 14C, reference numeral 701 indicates a meshing portion where a lower seam end portion of a solar cell module on the ridge side is meshed with the meshing portion while being inserted therein. Reference numeral 702 indicates a fixing portion which is contacted to a supporting member as a backing, reference numeral 703 a raised portion for connecting the fixing portion 702 and the meshing portion 701, and reference numeral 704 an underhole into which a drilling tapping screw is inserted to fix the fixing portion 702 to a sheathing. Reference numeral 705 indicates a holding portion for retaining a ridge side lower end portion of the solar cell module.

The fixing member was prepared as will be described below.

A stainless steel plate having a thickness of 1 mm was cut to obtain a member having a width of 110 mm and a length of 80 mm. The member thus obtained was processed using a press working machine to form a basic form of the above fixing member which has a meshing portion 701 and a raised portion 703. The basic form was subjected to to cutting processing and folding processing to form a holding portion 705. In this example, the width of the fixing member in a direction to the main frame was made to be greater, and the holding portion 705 was formed at a position shifted from the position of the meshing portion 701. For the resultant, by way of laser processing, there were formed two protruded portions 708 in a triangular form at different positions in an area 707 above the meshing portion 701. When the solar cell module is fixed by means of the fixing member, the protruded portions 708 are contacted with the upper portion (205, see FIG. 10A) of the under seam of the solar cell module, whereby the protruded portions 708 chip the coating face of the backing plate of the solar cell module by virtue of sliding to surely contact the metal constituent of the backing plate, whereby electric continuity between the backing plate and the fixing member is attained.

Here, the height 706 of the raised portion 703 is 23 mm.

Solar Cell Module

In this example, there were used a plurality of flexible amorphous silicon solar cell modules prepared in the same manner as in Example 1.

Constitution of Roof Face

FIG. 15 is a schematic cross-sectional view of a roof, viewed from the main frame direction, when a solar cell module is installed on a roof face. In FIG. 15, reference numeral 801 indicates a sheathing roof board. In this example, a plywood having a thickness of 12 mm was used as the sheathing roof board. Reference numeral 802 indicates a waterproof roofing member. In this example, an asphalt-impregnated type 22 Kg member was used as the waterproof roofing member.

On the waterproof roofing member 802, at least an electrically conductive communicating member 803 (this will be described later) was laid so as to pass under the solar cell module 804.

Although not detailed in FIG. 15, a plurality of solar cell modules provided in the above were sequentially arranged from the eaves side to form a plurality of stage groups, each comprising a plurality of solar cell modules arranged while being electrically connected with each other on the roof face.

Particularly, after the solar cell module 804 was arranged, the solar cell module was fixed onto the sheathing roof board 801 and to the electrically conductive communicating member 803 using the fixing member 805 having the configuration shown in FIGS. 14A to 14C and a drilling tapping screw 806 (applied with UNICHRO treatment, M4×30 mm). In this example, four fixing members having the configuration shown in FIGS. 14A to 14C which has the protruded portions 708 in the area 807 above the meshing portion and which functions to conduct earthing were used in order to fix each solar cell module.

In FIG. 15, reference numeral 807 indicates a junction box, reference numeral 808 a connection cable, reference numeral 809 a rafter, and reference numeral 810 a main frame.

When the solar cell module was fixed to the underlayment by means of the fixing members having the configuration of FIGS. 14A to 14C, the protruded portions 708 were contacted with the upper portion (205, see FIG. 10A) of the under seam of the solar cell module, whereby the protruded portions 708 chipped the coating face of the backing plate of the solar cell module by virtue of sliding to surely contact the metal constituent of the backing plate, whereby electric continuity between the backing plate and the fixing member was attained.

After completing the installation execution work for the solar cell modules of a first stage group in the manner as above described, the last solar cell module of the first stage group was electrically connected to an initial solar cell module of a second stage group by means of a connection cable, and the solar cell modules of the second stage group were installed. In this way, the solar cell modules of the successive stage groups were installed.

Finally, on the electrically conductive communicating member situated in the vicinity of a wire-uptaking hole provided in the vicinity of the ridge, an earthing line of 5.5 $mm^2$ having a crimp-style terminal was fixed by means of a hexagonal self-drilling tapping screw having a flange, followed by drawing into the indoor through an opening provided at the roof face together with the cables extending from the solar cell modules of all the stage groups. The earthing line was electrically connected to a class 3 earth.

As the electrically conductive communicating member 603 used in the above, a hot-dipped zinc-coated steel sheet having a thickness of 0.35 mm and a size of 910 mm×455 mm usable as a back roofing member was used. Because the steel sheet was deficient in length to traverse the roof face, another hot-dipped zinc-coated steel sheet was added to the previous steel sheet. In the addition in this case, the overlapped portion of the two steel sheets was made to be more than 100 mm×100 mm, and the overlapped portion was fixed using drill vises so as to ensure their electrical continuity.

In this example, by using the solar cell module-fixing members as above described, a space is established between the ridge side lower end portion of the solar cell module and the sheathing as shown in FIG. 15. As a result, without requiring a lifting means such as a spacer to lift the solar cell module, electrical connection of the solar cell modules in a water flow direction can be readily conducted through the space.

Also, because the fixing member has the holding portion to retain a ridge side end portion of the solar cell module as above described, the opposite end portions of the solar cell module in a water flow direction are firmly fixed, whereby the solar cell module is made to have satisfactory mechanical strength.

Further, by making the fixing member have a structure for earthing as above described, earthing for the solar cell module can be conducted at the same time as fixing the solar cell module. Therefore, it is not necessary to separately conduct the execution work for the solar cell modules and the earthing work. This diminishes the execution costs.

In addition, the protruded portions of the fixing member comprise the same constituent as the fixing member as above described. As a result, the fixing member in this example can be prepared at a reasonable production cost while reducing the material cost, and the earthing of the solar cell module can be readily attained only by fixing the fixing member to the solar cell module. Therefore, the execution work can be efficiently conducted.

Evaluation of Earthing

In order to confirm the reliability of the continuity of the above earthing, there were prepared three small samples (Sample No.1 to Sample No. 3) having a configuration which is the same as that in the above where the solar cell modules were arranged on the roof face. For each of these samples, evaluation was conducted in the same manner as in Example 1.

The evaluated results are collectively shown in Table 3. From the results shown in Table 3, it is understood that the continuity of the earthing in this example is satisfactory.

EXAMPLE 4

In this example, a solar cell module array was established by fixing a flexible roofing member integral type solar cell module processed in a stepping roofing member form to a roof face using a fixing member according to the present invention and connecting connection cables to the solar cell module.

In the following, detailed description will be made of the solar cell module array in this example.

Fixing Member

Figures 16A, 16B, 16C:
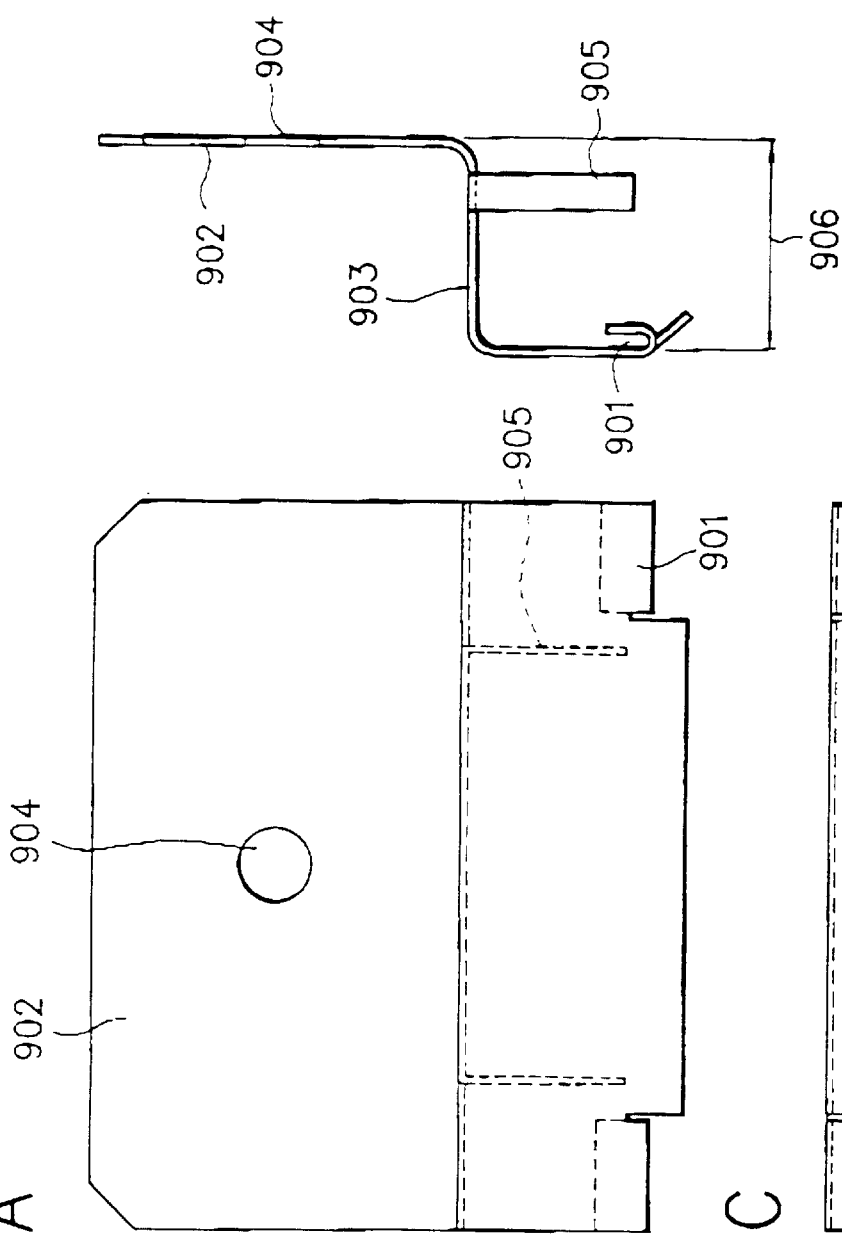
FIGS. 16A to 16C are schematic views illustrating a fixing member in Example 4 of the present invention which will be described later.

As the fixing member, there was used a fixing member having such configuration as shown in FIGS. 16A to 16C. FIG. 16A is a schematic plan view, FIG. 16B is a schematic elevation view, and FIG. 16C is a schematic side view. In FIGS. 16A to 16C, reference numeral 901 indicates a meshing portion where a lower seam end portion of a solar cell module on the ridge side is meshed with the meshing portion while being inserted therein. Reference numeral 902 indicates a fixing portion which is contacted to a supporting member as a backing, reference numeral 903 a raised portion for connecting the fixing portion 902 and the meshing portion 901, and reference numeral 904 an underhole into which a drilling tapping screw is inserted to fix the fixing portion 902 to a sheathing. Reference numeral 905 indicates a holding portion for retaining a ridge side lower end portion of the solar cell module.

The fixing member was prepared as will be described below.

A stainless steel plate having a thickness of 1 mm was cut to obtain a member having a width of 70 mm and a length of 80 mm. The member thus obtained was processed using a press working machine to form a basic form of the above fixing member which has a meshing portion 901 and a raised portion 903. The basic form was subjected to cutting processing and folding processing to form a holding portion 905. In this example, a slit was formed in each of the opposite end portions of the raised portion 903 of the fixing member, and the holding portion 905 was formed by turning up in a direction to the eaves.

Here, the height 906 of the raised portion 903 is 22 mm.

Solar Cell Module

In this example, there were used a plurality of flexible amorphous silicon solar cell modules prepared in the same manner as in Example 1.

Constitution of Roof Face

Figure 17:
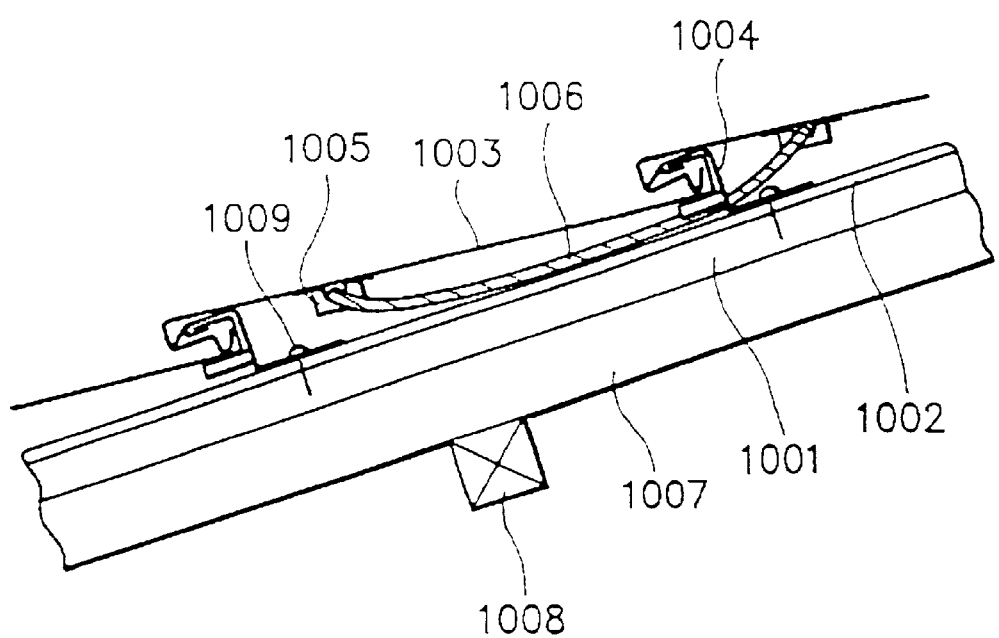
FIG. 17 is a schematic cross-sectional view illustrating a roof on which a solar cell module is installed in Example 4 of the present invention which will be described later.

FIG. 17 is a schematic cross-sectional view of a roof, viewed from the main frame direction, when a solar cell module is installed on a roof face. In FIG. 17, reference numeral 1001 indicates a sheathing roof board. In this example, a plywood having a thickness of 12 mm was used as the sheathing roof board. Reference numeral 1002 indicates a waterproof roofing member. In this example, an asphalt-impregnated type 22 Kg member was used as the waterproof roofing member.

On the waterproof roofing member 1002, a plurality of solar cell modules 1003 provided in the above were sequentially arranged from the eaves side to form a plurality of stage groups, each comprising a plurality of solar cell modules arranged while being electrically connected with each other on the roof face.

Particularly, after the solar cell module 1003 was arranged, the solar cell module was fixed onto the sheathing roof board 1001 using the fixing member 1004 having the configuration shown in FIGS. 16A to 16C and a drilling tapping screw 1009 (applied with UNICHRO treatment, M4×30 mm). In this example, four fixing members having the configuration shown in FIGS. 16A to 16C were used in order to fix each solar cell module.

In FIG. 17, reference numeral 1005 indicates a junction box, reference numeral 1006 a connection cable, reference numeral 1007 a rafter, and reference numeral 1008 a main frame.

After completing the installation execution work for the solar cell modules of a first stage group in the manner as above described, the last solar cell module of the first stage group was electrically connected to an initial solar cell module of a second stage group by means of a connection cable, and the solar cell modules of the second stage group were installed. In this way, the solar cell modules of successive stage groups were installed.

In this example, by using the solar cell module-fixing members as above described, a space is established between the ridge side lower end portion of the solar cell module and the sheathing as shown in FIG. 17. As a result, without requiring a lifting means such as a spacer to lift the solar cell module, electrical connection of the solar cell modules in a water flow direction can be readily conducted through the space.

Also, because the fixing member has the holding portion to retain a ridge side end portion of the solar cell module as above described, the opposite end portions of the solar cell module in a water flow direction are firmly fixed, whereby the solar cell module is made to have satisfactory mechanical strength.

In addition, the holding portion of the fixing member is formed by way of cutting and folding as above described. Thus, the formation thereof is simple, and the fixing member can be prepared at a reasonable production cost while reducing the material cost.

Further, the holding portion of the fixing member in this example has a longwise cross section. Thus, the holding portion has a structure which is difficult to bend.

EXAMPLE 5

In this example, a solar cell module array was established by fixing a flexible roofing member integral type solar cell module processed in a ribbed seam roofing member form to a sheathing face of a roof face using a fixing member according to the present invention and connecting connection cables to the solar cell module.

In the following, detailed description will be made of the solar cell module array in this example.

Fixing Member

Figure 18A:
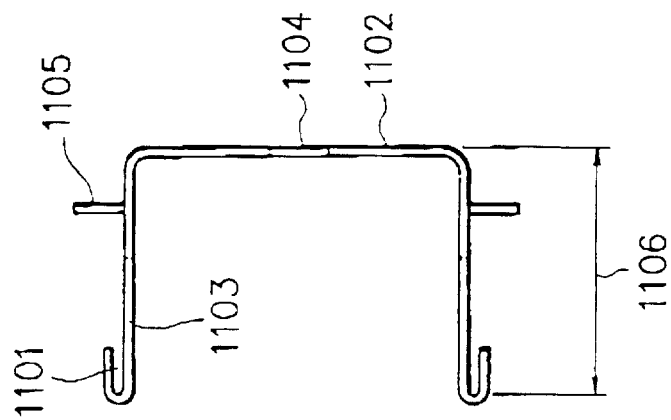
FIGS. 18A to 18C are schematic views illustrating a fixing member in Example 5 of the present invention which will be described later.
Figure 18B:
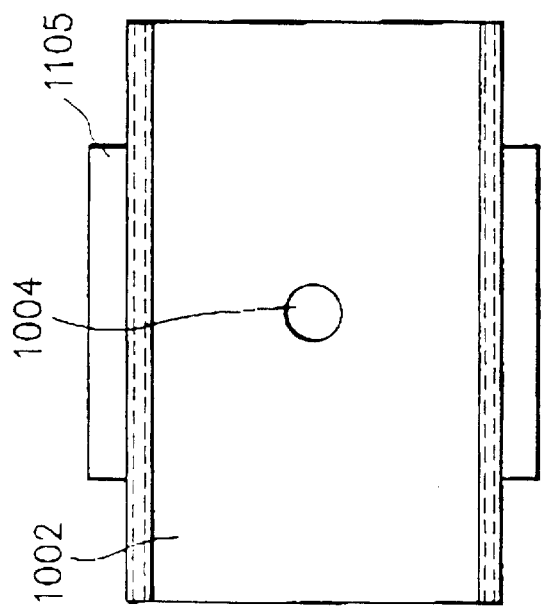
Figure 18C:
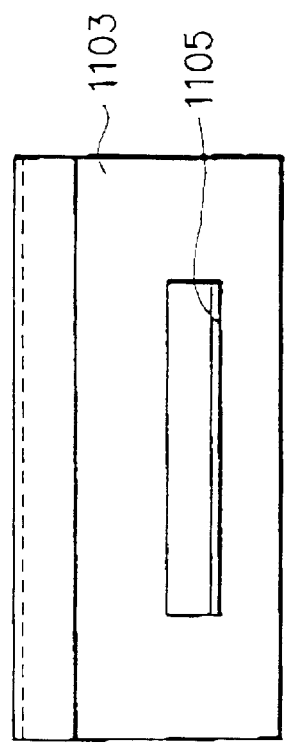

As the fixing member, there was used a fixing member having such configuration as shown in FIGS. 18A to 18C. FIG. 18A is a schematic plan view, FIG. 18B is a schematic elevation view, and FIG. 18C is a schematic side view.

In FIGS. 18A to 18C, reference numeral 1101 indicates a meshing portion where a lower seam end portion of a solar cell module on the ridge side is meshed with the meshing portion while being inserted therein. Reference numeral 1102 indicates a fixing portion which is contacted to a supporting member as a backing, reference numeral 1103 a raised portion for connecting the fixing portion 1102 and the meshing portion 1101, and reference numeral 1104 an underhole into which a drilling tapping screw is inserted to fix the fixing portion 1102 to a sheathing. Reference numeral 1105 indicates a holding portion for retaining a lower end portion of the rear face of the solar cell module.

The fixing member was prepared as will be described below.

A stainless steel plate having a thickness of 0.5 mm was cut to obtain a member having a width of 50 mm and a length of 100 mm. The member thus obtained was processed using a press working machine to form a basic form of the above fixing member which has a meshing portion 1101 and a raised portion 1103. The basic form was subjected to cutting processing and folding processing to form a holding portion 1105. In this example, a slit was formed in the raised portion 1103 of the fixing member, and the holding portion 1105 was formed by turning up in a direction to the side where the solar cell module is fixed.

Here, the height 1106 of the raised portion 1103 is 45 mm.

Solar Cell Module

Figure 19A:
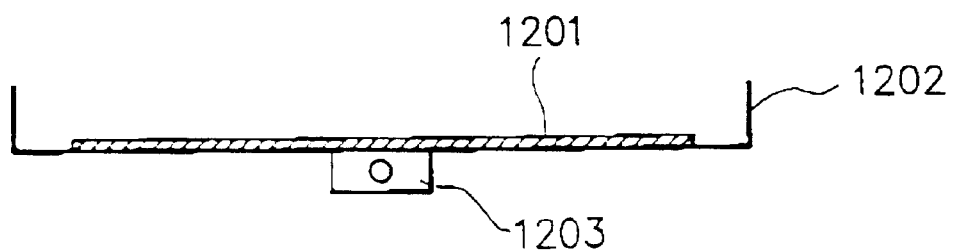
FIGS. 19A and 19B are schematic views illustrating a roof integral type solar cell module used in Example 5 of the present invention which will be described later.
Figure 19B:
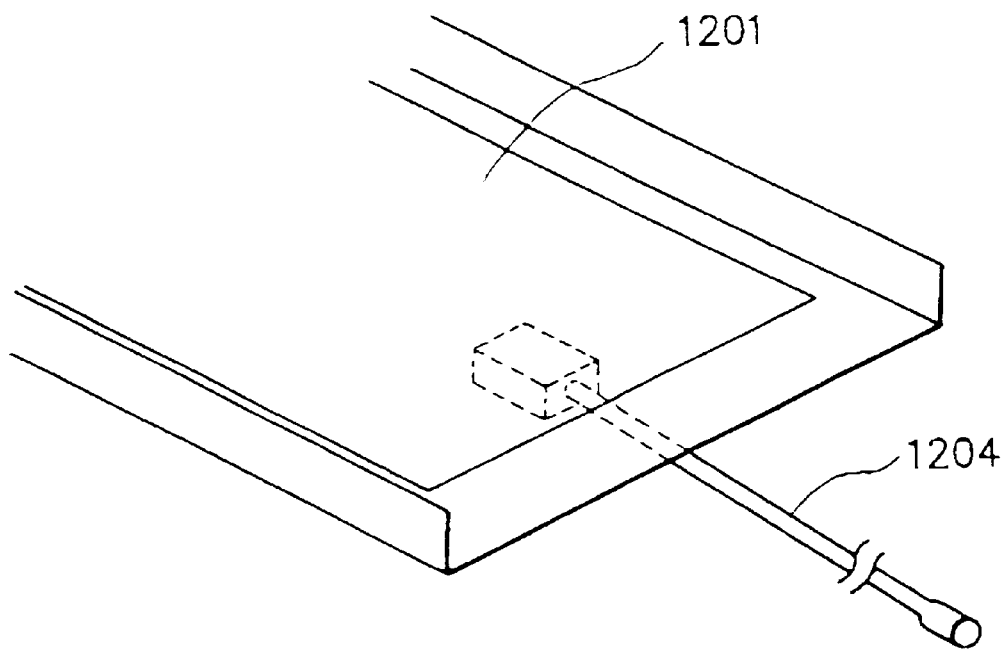

In this example, there were used a plurality of flexible amorphous silicon solar cell modules prepared in the same manner as in Example 1. Each solar cell module was processed into a batten seam roofing member form having such configuration as shown in FIGS. 19A and 19B using a roll forming machine. FIG. 19A is a schematic cross-sectional view of the solar cell module, and FIG. 19B is a schematic slant view of a side end portion of the solar cell module. In FIGS. 19A and 19B, reference numeral 1201 indicates a solar cell string comprising a plurality of solar cells (photovoltaic elements) electrically connected with each other in series connection. Each of the opposite side end portions of the solar cell module shown in FIGS. 19A and 19B is bent to form a raised side end portion 1202 which is used in fixing the solar cell module. Reference numeral 1203 indicates a junction box, and reference numeral 1204 a connection cable.

In this example, each raised end portion 1202 has a height of 27 mm.

Particularly, at the rear face of the solar cell module, a pair of junction boxes 1203 made of polycarbonate and having a height of 13.4 mm, one being for a positive terminal extended from the solar cell string 1201 and the other being for a negative terminal extended from the solar cell string are provided. From each junction box 1203, a connection cable 1204 having an outer diameter of 6.4 mm is extended to the outside.

Constitution of Roof Face

Figure 20:
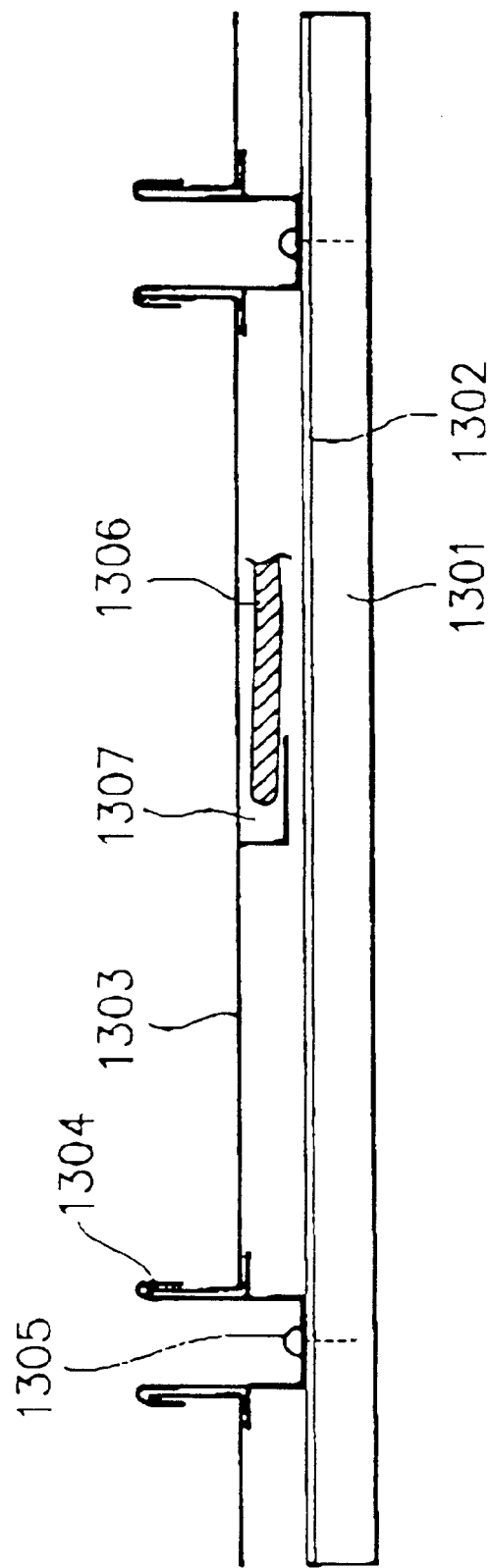
FIG. 20 is a schematic cross-sectional view illustrating a roof on which a solar cell module is installed in Example 5 of the present invention which will be described later.

FIG. 20 is a schematic cross-sectional view of a roof, viewed from the main frame direction, when the foregoing solar cell module is installed on a roof face. In FIG. 20, reference numeral 1301 indicates a sheathing roof board. In this example, a plywood having a thickness of 12 mm was used as the sheathing roof board. Reference numeral 1302 indicates a waterproof roofing member. In this example, an asphalt-impregnated type 22 Kg member was used as the waterproof roofing member. Reference numeral 1304 indicates the foregoing fixing member, reference numeral 1306 a connection connector, and reference numeral 1307 the foregoing junction box.

In this example, on the waterproof roofing member 1302, a plurality of solar cell modules 1303 provided in the above were sequentially arranged from the eaves side to form a plurality of stage groups, each comprising a plurality of solar cell modules arranged while being electrically connected with each other on the roof face.

Particularly, after the solar cell module 1303 was arranged, it was fixed onto the sheathing roof board 1301 using the fixing member 1304 having the configuration shown in FIGS. 18A to 18C and a drilling tapping screw 1305 (made of SUS304, M×30 mm). Then, through the fixing member 1304, the successive solar cell module was arranged. After the connector 1306 was connected thereto, the solar cell module was fixed to the fixing member. In this way, all the solar cell modules were installed on the roof face.

In this example, four fixing members having the configuration shown in FIGS. 18A to 18C were used in order to fix each solar cell module.

The batten seam roofing member integral type solar cell modules used in this example cannot be fixed to the sheathing roof board as they are because the junction boxes are provided at their rear faces as shown in FIGS. 19A and 19B.

Thus, as shown in FIG. 20, by using the fixing members according to the present invention, a space is established between the rear face of the solar cell module and the sheathing roof board. As a result, without requiring a lifting means such as a spacer to lift the solar cell module, the junction boxes can be accommodated in the space, and electrical connection of the solar cell modules in the main frame direction or water flow direction can be readily conducted through the space.

EXAMPLE 6

In this example, a solar cell module array was established by fixing a flexible roofing member integral type solar cell module processed in a stepping roofing member form to a sheathing face of a roof face using a fixing member according to the present invention and connecting connection cables to the solar cell module.

In the following, detailed description will be made of the solar cell module array in this example.

Fixing Member

Figure 21A:
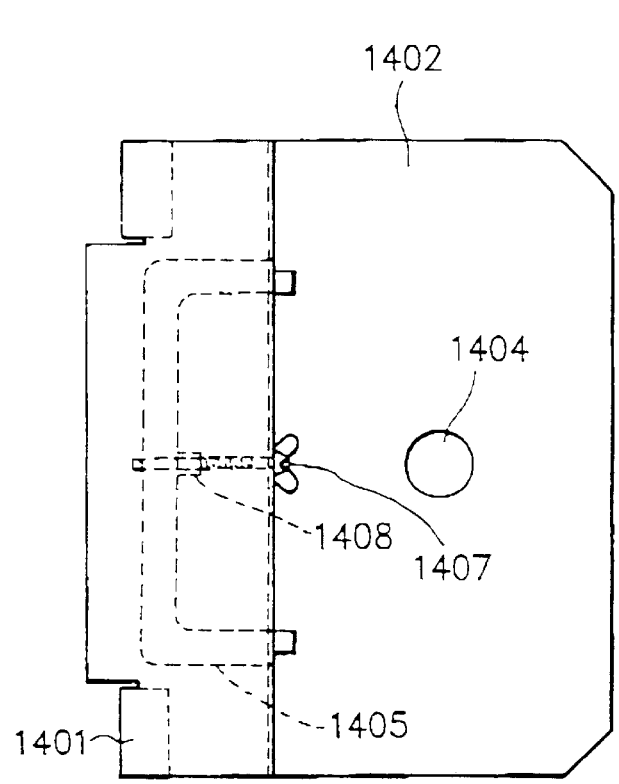
FIGS. 21A to 21C are schematic views illustrating a fixing member in Example 6 of the present invention which will be described later.
Figure 21C:
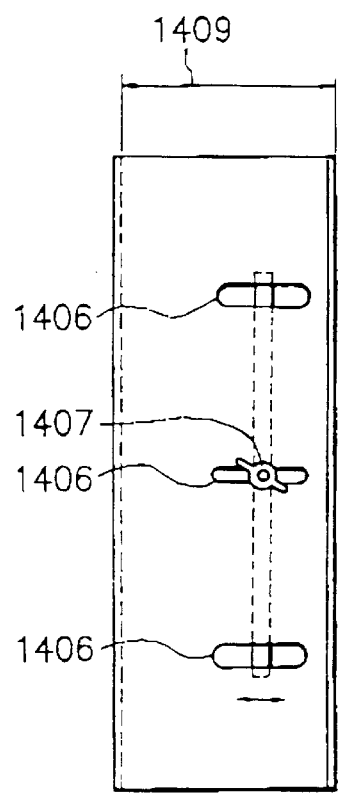
Figure 21B:
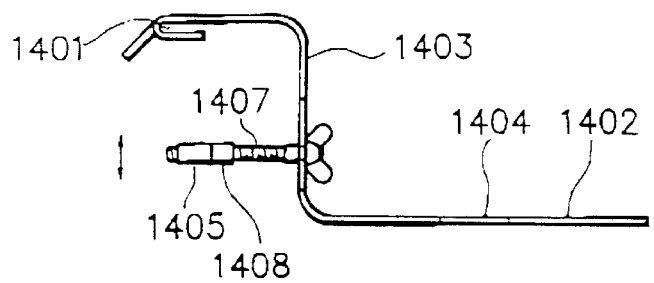

As the fixing member, there was used a fixing member having such configuration as shown in FIGS. 21A to 21C. FIG. 21A is a schematic plan view, FIG. 21B is a schematic elevation view, and FIG. 21C is a schematic side view. In FIGS. 21A to 21C, reference numeral 1401 indicates a meshing portion where a lower seam end portion of a solar cell module on the ridge side is meshed with the meshing portion while being inserted therein. Reference numeral 1402 indicates a fixing portion which is contacted to a supporting member as a backing, reference numeral 1403 a raised portion for connecting the fixing portion 1402 and the meshing portion 1401, and reference numeral 1404 an underhole into which a drilling tapping screw is inserted to fix the fixing portion 1402 to a sheathing. Reference numeral 1405 indicates a holding portion for retaining a ridge side end portion of the solar cell module.

The fixing member was prepared as will be described below.

A stainless steel plate having a thickness of 1 mm was cut to obtain a member having a width of 70 mm and a length of 80 mm. The member thus obtained was processed using a press working machine to form a basic form of the above fixing member which has a meshing portion 1401, a fixing portion 1402 and a raised portion 1403. Three predetermined portions of the raised portion 1403 were perforated by way of perforating processing to form three relatively long holes 1406 as shown in FIG. 21C. A 6 mm thick stainless steel plate was subjected to die cutting to form a holding portion 1405. A central portion of the holding portion 1405 was perforated to form a screw hole of M4, and a burring portion 1408 was provided. A screw bolt 1407 of M4 was inserted in the center hole 1406 of the raised portion 1403, followed by meshing with the screw hole of the holding portion 1405. The holding portion 1405 can be fixed at a desired upper or lower position by fastening the screw bolt 1407.

Here, the height 1409 of the raised portion 1403 is 22 mm.

Solar Cell Module

In this example, there were used a plurality of flexible amorphous silicon solar cell modules prepared in the same manner as in Example 1. Each solar cell module was processed into a stepping roofing member form.

Constitution of Roof Face

FIG. 22 is a schematic cross-sectional view of a roof, viewed from the main frame direction, when the foregoing solar cell module is installed on a roof face. In FIG. 22, reference numeral 1501 indicates a sheathing roof board. In this example, a plywood having a thickness of 12 mm was used as the sheathing roof board. Reference numeral 1502 indicates a waterproof roofing member. In this example, an asphalt-impregnated type 22 Kg member was used as the waterproof roofing member. Reference numeral 1503 indicates the foregoing solar cell module. Reference numeral 1504 indicates the foregoing fixing member. Reference numeral 1505 indicates a drilling tapping screw, reference numeral 1506 a screw bolt, reference numeral 1507 a junction box, reference numeral 1508 a connection cable, reference numeral 1509 a rafter, and reference numeral 1510 a main frame.

Although not detailed in FIG. 22, the foregoing solar cell modules provided in the above were sequentially arranged from the eaves side to form a plurality of stage groups, each comprising a plurality of solar cell modules arranged while electrically connected with each other on the roof face.

Particularly, after the solar cell module was arranged, it was fixed onto the sheathing roof board 1501 using the fixing member 1504 having the configuration shown in FIGS. 21A to 21C and a drilling tapping screw 1505 comprising a UNICHRO (trademark name, M4×30 mm). In this example, three fixing members of the configuration shown in FIGS. 21A to 21C were used to fix each solar cell module.

After completing the installation work for the solar cell modules of a first stage group in the manner as above described, the last solar cell module of the first stage group was electrically connected to an initial solar cell module of a second stage group by means of a connection cable, and the solar cell modules of the second stage group were installed. In this way, the solar cell modules of successive stage groups were installed.

In this example, prior to fixing the solar cell module, the fixing member was arranged so that holding portion 1405 (see, FIGS. 21A to 21C) was situated at the lowest position. After the solar cell module was fixed, the holding portion 1405 was lifted and a lower seam portion of the solar cell module was firmly fixed by means of the screw bolt 1506 (see, FIG. 22).

In this example, by using the solar cell module-fixing members as above described, a space is established between the ridge side end portion of the solar cell module and the sheathing as shown in FIG. 22. As a result, without requiring a lifting means such as a spacer to lift the solar cell module, electrical connection of the solar cell modules in a water flow direction can be readily conducted through the space.

Also, because the fixing member has the holding portion to retain a ridge side end portion of the solar cell module as above described, the opposite end portions of the solar cell module in a water flow direction are firmly fixed, whereby the solar cell module is made to have satisfactory mechanical strength.

Further, the fixing member in this example has a structure which can move up and down as above described. As a result, the fixing member can comply with various heights of a raised lower seam portion of a solar cell module.

EXAMPLE 7

In this example, a solar cell module array was established by fixing a flexible roofing member integral type solar cell module processed in a stepping roofing member form to a sheathing face of a roof face using a fixing member according to the present invention and connecting connection cables to the solar cell module.

In the following, detailed description will be made of the solar cell module array in this example.

Fixing Member

Figure 23A:
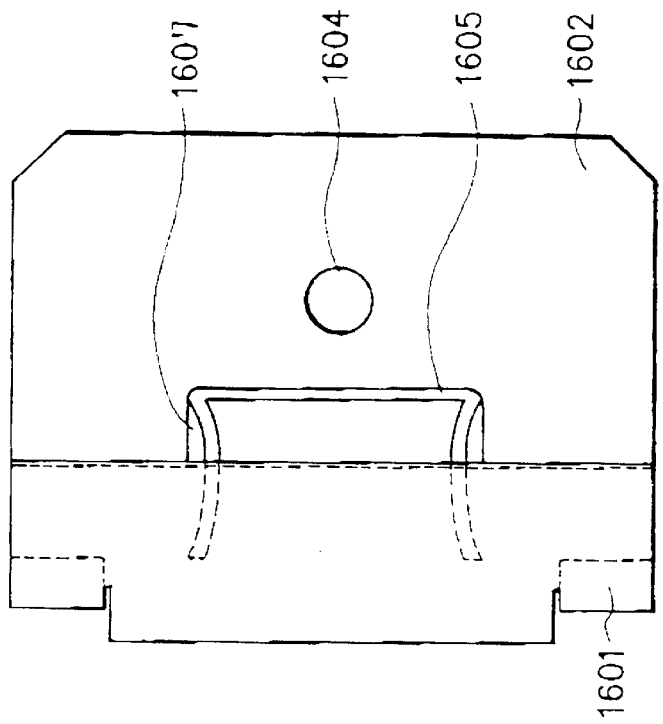
FIGS. 23A to 23D are schematic views illustrating a fixing member in Example 7 of the present invention which will be described later.
Figure 23B:
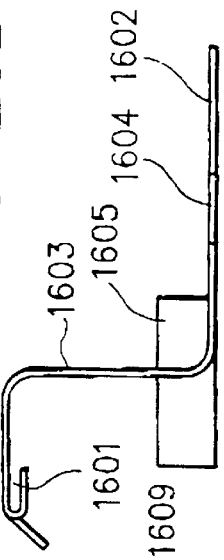
Figure 23D:
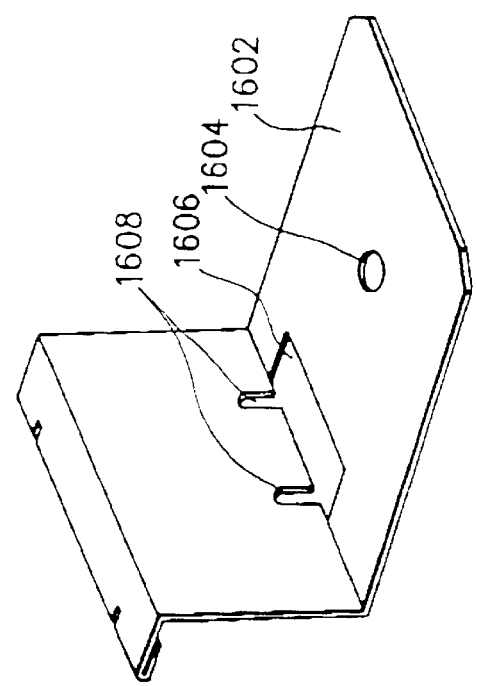
Figure 23C:
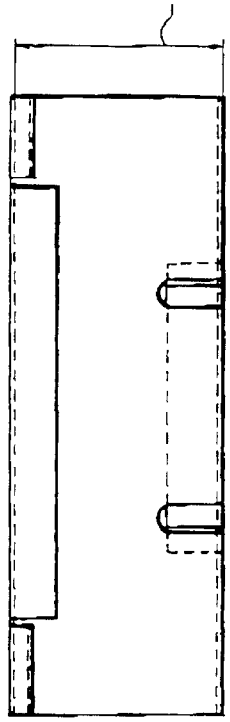

As the fixing member, there was used a fixing member having such configuration as shown in FIGS. 23A to 23D. FIG. 23A is a schematic plan view, FIG. 23B is a schematic elevation view, FIG. 23C is a schematic side view, and FIG. 23D is a schematic slant view. In FIGS. 23A to 23D, reference numeral 1601 indicates a meshing portion where a lower seam end portion of a solar cell module on the ridge side is meshed with the meshing portion while being inserted therein. Reference numeral 1602 indicates a fixing portion which is contacted to a supporting member as a backing, reference numeral 1603 a raised portion for connecting the fixing portion 1602 and the meshing portion 1601, and reference numeral 1604 an underhole into which a drilling tapping screw is inserted to fix the fixing portion 1602 to a sheathing. Reference numeral 1605 indicates a holding member for retaining a ridge side end portion of the solar cell module. In this example, the fixing member itself has no holding portion. Instead, the holding member 1605 which is independent from the fixing member is used.

The fixing member was prepared as will be described below.

A stainless steel plate having a thickness of 1 mm was cut to obtain a member having a width of 70 mm and a length of 80 mm. The member thus obtained was processed using a press working machine to form a basic form of the above fixing member which has a meshing portion 1601, a fixing portion 1602 and a raised portion 1603. The basic form thus obtained was subjected to cutting processing to form an opening portion 1606 at the fixing portion 1602 for inserting a holding member 1605 in said opening portion and two slits 1608 at the raised portion 1603 (see, FIG. 23D).

The holding member 1605 was independently formed using a 1 mm thick stainless steel member for a spring. The holding member 1605 is structured to have a pair of legs 1607 having spring properties at each of the opposite end sides as shown in FIG. 23A. Each pair of legs 1607 of the holding member are normally in an opened state, and they are forcibly inserted in one of the slits 1608, where the two pairs of legs 1607 act to unfold toward the outer sides, and, by virtue of the unfolding force, the holding member 1605 is fixed to the fixing member. Here, the height 1609 of the raised portion 1603 is 22 mm.

In this example, as above described, the holding portion of the fixing member comprises the holding member separately formed of a material which is different from the constituent of the fixing member, and by inserting the opening portion of the fixing member, the holding portion of the fixing member is established.

Solar Cell Module

In this example, there were used a plurality of flexible amorphous silicon solar cell modules prepared in the same manner as in Example 1. Each solar cell module was processed into a stepping roofing member form.

Constitution of Roof Face

Figure 24:
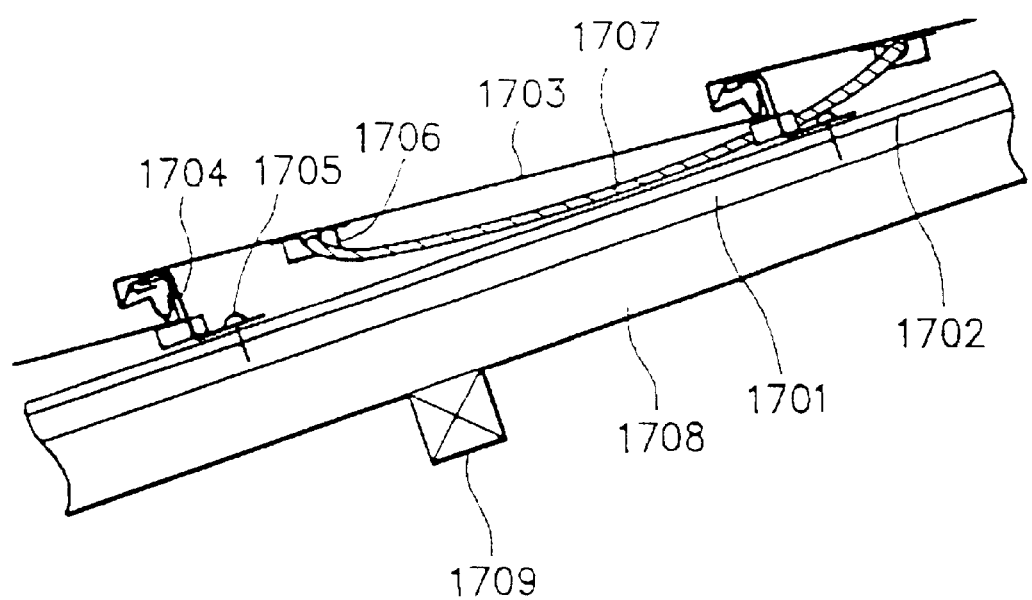
FIG. 24 is a schematic cross-sectional view illustrating a roof on which a solar cell module is installed in Example 7 of the present invention which will be described later.

FIG. 24 is a schematic cross-sectional view of a roof, viewed from the main frame direction, when the foregoing solar cell module is installed on a roof face. In FIG. 24, reference numeral 1701 indicates a sheathing roof board. In this example, a plywood having a thickness of 12 mm was used as the sheathing roof board. Reference numeral 1702 indicates a waterproof roofing member. In this example, an asphalt-impregnated type 22 Kg member was used as the waterproof roofing member. Reference numeral 1703 indicates the foregoing solar cell module. Reference numeral 1704 indicates the foregoing fixing member. Reference numeral 1706 indicates a junction box, reference numeral 1707 a connection cable, reference numeral 1708 a rafter, and reference numeral 1709 a main frame.

Although not detailed in FIG. 24, the foregoing solar cell modules provided in the above were sequentially arranged from the eaves side to form a plurality of stage groups, each comprising a plurality of solar cell modules arranged while electrically connected with each other on the roof face.

Particularly, after the solar cell module was arranged, it was fixed onto the sheathing roof board 1701 using the fixing member 1704 having the configuration shown in FIGS. 23A to 23D and a drilling tapping screw 1705 (applied with UNICHRO treatment, M4×30 mm). In this example, four fixing members of the configuration shown in FIGS. 23A to 23D were used to fix each solar cell module.

After completing the installation work for the solar cell modules of a first stage group in the manner as above described, the last solar cell module of the first stage group was electrically connected to an initial solar cell module of a second stage group by means of a connection cable, and the solar cell modules of the second stage group were installed. In this way, the solar cell modules of successive stage groups were installed.

In this example, by using the solar cell module-fixing members as above described, a space is established between the ridge side end portion of the solar cell module and the sheathing as shown in FIG. 24. As a result, without requiring a lifting means such as a spacer to lift the solar cell module, electrical connection of the solar cell modules in a water flow direction can be readily conducted through the space.

Also, the fixing member in this example has the holding portion comprising the holding member in order to retain a ridge side end portion of the solar cell module as above described. As a result, the opposite end portions of the solar cell module in a water flow direction are firmly fixed, whereby the solar cell module is made to have satisfactory mechanical strength.

Further, the holding member as the holding portion of the fixing member in this example is independent from the fixing member, and it is constituted by a material having spring properties which is different from the constituent of the fixing member as above described. The holding member is used in a manner that it is inserted in the fixing member after the solar cell module is meshed with and fixed to the fixing member. When the fixing member in this example is designed so as to achieve a reduced production cost, it can be produced at a production cost which is smaller than that in the case of producing an integral type fixing member.

In addition, because the holding member as the holding portion of the fixing member is made of the spring material as above described, it can be firmly fixed to the fixing member. Further, because the holding member as the holding portion of the fixing member has a structure with a longwise prolonged cross section, it is hardly twisted.

EXAMPLE 8

In this example, a solar cell module array was established by fixing a flexible roofing member integral type solar cell module processed in a stepping roofing member form to a roof face provided with a spacer using a fixing member according to the present invention and connecting connection cables to the solar cell module.

In the following, detailed description will be made of the solar cell module array in this example.

Fixing Member

As the fixing member, there was used a fixing member having the configuration in FIGS. 8A and 8B which is the same as that of the fixing member used in Example 1, except that the height of the raised portion was made to be 44 mm.

Solar Cell Module

In this example, there were used a plurality of flexible amorphous silicon solar cell modules prepared in the same manner as in Example 1. Each solar cell module was processed into a stepping roofing member form.

Constitution of Roof Face

FIG. 25 is a schematic cross-sectional view of a roof, viewed from the main frame direction, when the foregoing solar cell module is installed on a roof face. In FIG. 25, reference numeral 1801 indicates a sheathing roof board. In this example, a plywood having a thickness of 12 mm was used as the sheathing roof board. Reference numeral 1802 indicates a waterproof roofing member. In this example, an asphalt-impregnated type 22 Kg member was used as the waterproof roofing member.

On the waterproof roofing member 1802, an electrically conductive communicating member 1811 (this will be detailed later) was laid, followed by laying a plurality of spacers 1803 of 30 mm×30 mm in size thereon as shown in FIG. 25. Then, the foregoing solar cell modules 1804 provided in the above were sequentially arranged from the eaves side to form a plurality of stage groups, each comprising a plurality of solar cell modules arranged while electrically connected with each other on the roof face.

Particularly, after the solar cell module was arranged, it was fixed onto the sheathing roof board 1801 using the above-described fixing member 1805 having the configuration shown in FIGS. 8A and 8B and a drilling tapping screw 1806 (applied with UNICHRO treatment, M4×30 mm). In this example, four fixing members of the configuration shown in FIGS. 8A and 8B were used to fix each solar cell module.

After completing the installation work for the solar cell modules of a first stage group in the manner as above described, the last solar cell module of the first stage group was electrically connected to an initial solar cell module of a second stage group by means of a connection cable, and the solar cell modules of the second stage group were installed. In this way, the solar cell modules of successive stage groups were installed.

In FIG. 25, reference numeral 1807 indicates a junction box, reference numeral 1808 a connection cable, reference numeral 1809 a rafter, and reference numeral 1810 a main frame.

As the electrically conductive communicating member 1811 used in the above, a hot-dipped zinc-coated steel sheet having a thickness of 0.35 mm and a size of 910 mm×455 mm usable as a back roofing member was used. Because the steel sheet was deficient in length to traverse the roof face, another hot-dipped zinc-coated steel sheet was added to the previous steel sheet. In the addition in this case, the overlapped portion of the two steel sheets was made to be more than 100 mm×100 mm, and the overlapped portion was fixed using drill vises so as to ensure their electrical continuity.

In this example, by using the solar cell module-fixing members as above described, even when the electrically conductive communicating member is laid on the sheathing roof board and the spacers are provided thereon, the solar cell modules can be readily fixed onto the sheathing, and, in addition, a desirable space for connecting the connection cables from the solar cell modules can be established.

In a conventional roof structure having an electrically conductive communicating member on spacers, deformation is likely to occur at the electrically conductive communicating member. Accordingly, the workability is inferior. But according to this example, even when the electrically conductive communicating member is not situated just below the solar cell module (on the spacer), earthing can be desirably conducted.

EXAMPLE 9

In this example, a solar cell module array was established by fixing a flexible roofing member integral type solar cell module processed in a stepping roofing member form to a roof face using a fixing member according to the present invention and connecting connection cables to the solar cell module.

In the following, detailed description will be made of the solar cell module array in this example.
Fixing Member The fixing member in this example comprises a fixing member and a holding member constituted by a constituent material which is different than that of the fixing member.

The fixing member comprises a fixing member having the configuration in FIGS. 8A and 8B which is the same as that of the fixing member used in Example 1, except that the height of the raised portion was made to be 44 mm.

The holding member is configured as shown in FIGS. 26A to 26D. FIG. 26A is a schematic plan view of the holding member, FIG. 26B is a schematic elevation view of the holding member, FIG. 26C is a schematic slant view of the holding member, and FIG. 26D is a schematic state view when the holding member is incorporated with the fixing member.

The holding member comprises a fixing portion 1901 which is fixed to a sheathing face; a holding portion 1902 which serves to retain a ridge side end portion of a solar cell module; a stopper 1903 for preventing the holding member from being crawled under the solar cell module when the holding member is inserted under the solar cell module; a supporting portion 1904; and an underhole 1905.

Figure 27:
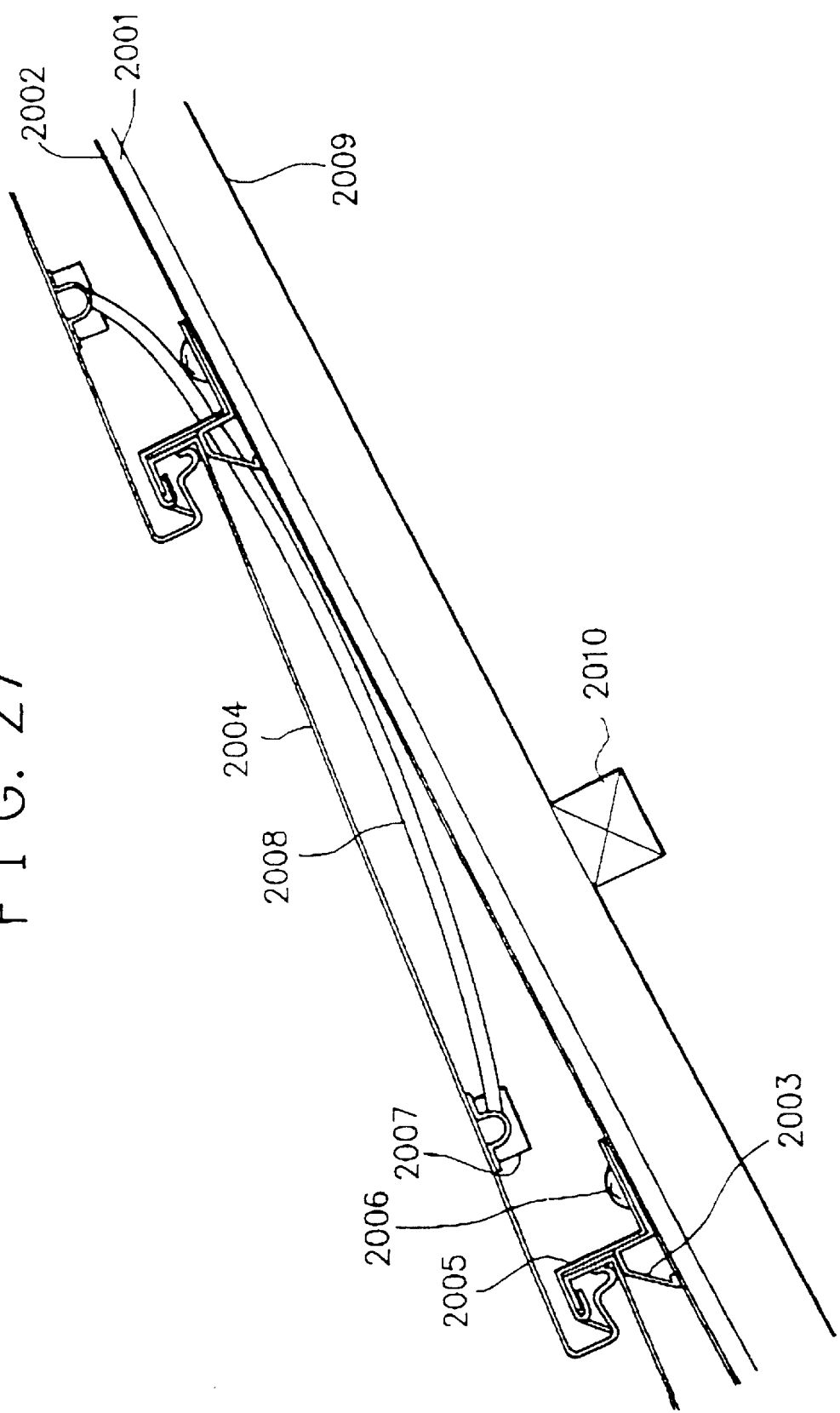
FIG. 27 is a schematic cross-sectional view illustrating a roof on which a solar cell module is installed in Example 9 of the present invention which will be described later.

As shown in FIG. 26D, the fixing portion of the fixing member 1907 is overlapped on the fixing portion 1901 of the holding member, and the overlapped portion is fixed by driving a vise. The stopper 1903 was formed by notching a predetermined portion of the holding portion 1902 by way of laser machining and raising the notched portion. An intermediate portion 1906 which is curved is provided between the holding portion 1902 and the supporting portion 1904 in order to prevent a stress from being converged at the intermediate portion when load is applied from above.
Solar Cell Module In this example, there were used a plurality of flexible amorphous silicon solar cell modules prepared in the same manner as in Example 1. Each solar cell module was processed into a stepping roofing member form.
Constitution of Roof Face FIG. 27 is a schematic cross-sectional view of a roof, viewed from the main frame direction, when the foregoing solar cell module is installed on a roof face. In FIG. 27, reference numeral 2001 indicates a sheathing roof board. In this example, a plywood having a thickness of 12 mm was used as the sheathing roof board. Reference numeral 2002 indicates a waterproof roofing member. In this example, an asphalt-impregnated type 22 Kg member was used as the waterproof roofing member.

On the waterproof roofing member 2002 and under the ridge side of a solar cell module 2004 (comprising the foregoing solar cell module), four holding members 2003 (each comprising the foregoing holding member) were arranged in the longitudinal direction, and a fixing member 2005 (comprising the foregoing fixing member) was overlapped on each holding member 2003, and each overlapped portion was fixed by means of a drilling tapping screw 2006 (applied with UNICHRO treatment, M4×30 mm).

In this way, the foregoing solar cell modules provided in the above were sequentially arranged from the eaves side to form a plurality of stage groups, each comprising a plurality of solar cell modules arranged while electrically connected with each other on the roof face.

After completing the installation work for the solar cell modules of a first stage group, the last solar cell module of the first stage group was electrically connected to an initial solar cell module of a second stage group by means of a connection cable, and the solar cell modules of the second stage group were installed. In this way, the solar cell modules of successive stage groups were installed.

In FIG. 27, reference numeral 2007 indicates a junction box, reference numeral 2008 a connection cable, reference numeral 2009 a rafter, and reference numeral 2010 a main frame.

In this example, by using, the solar cell module-fixing members as above described, a space is established between the ridge side end portion of the solar cell module and the sheathing as shown in FIG. 27. As a result, without requiring a lifting means such as a spacer to lift the solar cell module, electrical connection of the solar cell modules in a water flow direction can be readily conducted through the space.

Also, the fixing member in this example has the holding portion comprising the holding member in order to retain a ridge side end portion of the solar cell module as above described. As a result, the opposite end portions of the solar cell module in a water flow direction are firmly fixed, whereby the solar cell module is made to have satisfactory mechanical strength.

Further, the holding member as the holding portion of the fixing member in this example is independent from the fixing member. When the fixing member in this example is designed so as to obtain a reduced production cost, it can be produced at a production cost which is smaller than that in the case of producing an integral type fixing member.

In addition, the holding member as the holding portion of the fixing member in this example is provided with the stopper as above described. As a result, the positioning in a water flow direction can be efficiently conducted. Thus, the execution work can be efficiently conducted.

As apparent from the above description, a principal feature of the present invention lies in a fixing member for fixing a solar cell module or a roofing member with no solar cell on a roof installation face. A typical embodiment of the fixing member according to the present invention comprises a meshing portion to mesh at least a solar cell module or a part of a roofing member with no solar cell; a fixing portion to fix said fixing member to a roof installation face; and a raised portion for connecting said meshing portion and said fixing portion, wherein the distance between an end portion of said fixing portion and said meshing portion is made to be greater than the thickness of a portion of said solar cell module or said roofing member which is engaged in the meshing by said meshing portion. According to this constitution, a desirable space is established between the solar cell module and a sheathing situated under the solar cell module. Thus, without requiring a lifting means such as a spacer, said space can be established, and the connection of cables extending from the solar cells can be readily conducted through the space.

By making the fixing member have a holding portion to retain an end portion of the solar cell module, the opposite end portions of the solar cell module are firmly fixed. Thus, the solar cell module is made to have sufficient mechanical strength against flexure and vibration.

By making the tip of the holding portion of the fixing member in contact with the solar cell module not reach the position where the solar cells are situated on the light receiving face side of the solar cell module, the stress of the tip portion exerts no effect on the solar cells in the solar cell module.

Further, by forming the fixing member of an electrically conductive material so that the fixing member exhibits an electric potential which is the same as that of the solar cell module or the roofing member when the fixing member contacts an outer conductive portion of the solar cell module or the roofing member, roofing execution work and earthing execution work can be conducted at the same time. At the same time, by fixing the fixing member to an electrically conductive communicating member which has been previously laid, the solar cell module or the roofing member can be electrically grounded.

The above situation desirably diminishes the execution costs and the number of execution steps.

TABLE 1

|  | initial electronic resistance (mΩ) | electronic resistance after environmental test (mΩ) |
|---|---|---|
| Sample No. 1 | 3.80 | 5.20 |
| Sample No. 2 | 10.30 | 15.30 |
| Sample No. 3 | 5.10 | 8.45 |

TABLE 2

|  | initial electronic resistance (mΩ) | electronic resistance after environmental test (mΩ) |
|---|---|---|
| Sample No. 1 | 0.80 | 1.10 |
| Sample No. 2 | 1.00 | 1.30 |
| Sample No. 3 | 1.00 | 1.45 |

TABLE 3

|  | initial electronic resistance (mΩ) | electronic resistance after environmental test (mΩ) |
|---|---|---|
| Sample No. 1 | 0.70 | 5.80 |
| Sample No. 2 | 1.10 | 3.00 |
| Sample No. 3 | 1.10 | 3.20 |

What is claimed is:

1. A unitary fixing member for meshing and fixing a solar cell module or a solar cell-free module onto an installation face, said fixing member comprising:
   a meshing portion to mesh at least said solar cell module or a part of said solar cell-free module;
   a fixing portion to fix said fixing member to said installation face; and
   a raised portion to connect said meshing portion and said fixing portion,
   wherein said raised portion has a height which is greater than the thickness of a portion of said solar cell module or said solar cell-free module which is engaged in the meshing by said meshing portion,
   wherein said meshing portion, said fixing portion and said raised portion are integrally provided,
   wherein a space is established between said solar cell module or said solar cell-free module and said installation face, and
   wherein contact of said solar cell module or said solar cell-free module with said installation face is prevented when said solar cell module or said solar cell-free module is meshed.

2. A fixing member according to claim 1, wherein a minimum distance between the solar cell module or the solar cell-free module and the installation face is greater than an outer diameter of a connection cable provided at the solar cell module or the solar cell-free module, when the solar cell module or the solar cell-free module is fixed.

3. A fixing member according to claim 1, wherein a minimum distance between the solar cell module or the solar cell-free module and the installation face is greater than a height of a junction box provided at the solar cell module or the solar cell-free module, when the solar cell module or the solar cell-free module is fixed.

4. A fixing member according to claim 1, wherein a minimum distance between the solar cell module or the solar cell-free module and the installation face is the same as a height of a spacer provided on an installation face under the solar cell module or the solar cell-free module, when the solar cell module or the solar cell-free module is fixed.

5. A fixing member according to claim 1 further comprising a holding portion to retain an end portion of the solar cell or the solar cell-free module.

6. A fixing member according to claim 5, wherein a distance between a lower end portion of the fixing portion and the holding portion is greater than an outer diameter of a connection cable provided at the solar cell module or the solar cell-free module.

7. A fixing member according to claim 5, wherein a distance between a lower end portion of the fixing portion and the holding portion is greater than a height of a junction box provided at the solar cell module or the solar cell-free module.

8. A fixing member according to claim 5, wherein a tip of the holding portion which is in contact with the solar cell module does not reach a solar cell situated in a light receiving face side of the solar cell module.

9. A fixing member according to claim 5, wherein the holding portion is integrated with the fixing portion.

10. A fixing member according to claim 5, wherein the holding portion is provided separately from the fixing portion.

11. A fixing member according to claim 1, wherein the solar cell module is a building material integral type solar cell module.

12. A fixing member according to claim 11, wherein the building material integral type solar cell module is a roofing member integral type solar cell module.

13. The unitary fixing member according to claim 1, wherein said solar cell module or said solar cell-free module is electrically connected to another solar cell module or solar cell-free module, and wherein at least some of the electrical connection is located in said space.

14. A fixing member for fixing a solar cell module or a solar cell-free module onto an installation face, said fixing member comprising:
a meshing portion to mesh at least said solar cell module or a part of said solar cell-free module;
a fixing portion to fix said fixing member to said installation face; and
a raised portion to connect said meshing portion and said fixing portion,
wherein said raised portion has a height which is greater than the thickness of a portion of said solar cell module or said solar cell-free module which is engaged in the meshing by said meshing portion,
wherein said meshing portion, said fixing portion and said raised portion are integrally provided,
wherein a space is established between said portion of said solar cell module or said solar cell-free module which is engaged in the meshing and said installation face when said solar cell module or said solar cell-free module is engaged in the meshing,
wherein the fixing member is electrically conductive, thereby exhibiting an electric potential which is the same as that of the solar cell module or the solar cell-free module; and
wherein the fixing member is contacted with an outer conductive portion of the solar cell module or the solar cell-free module, thereby creating electrical continuity between the solar cell module or the solar cell-free module and the fixing member when the solar cell module or the roofing member is fixed.

15. A fixing member according to claim 14, wherein the fixing member is electrically conductive, thereby exhibiting an electric potential which is the same as that of the solar cell module or the solar cell-free module;
wherein the fixing member has a screw hole and an electrically conductive screw fastened in said screw hole; and
wherein said screw is contacted with an outer conductive portion of the solar cell module or the solar cell-free module, thereby creating electrical continuity between the solar cell module or the solar cell-free module and the screw, when the solar cell module or the solar cell-free module is fixed.

16. A fixing member according to claim 14, wherein the fixing member is electrically conductive, thereby exhibiting an electric potential which is the same as that of the solar cell module or the solar cell-free module;
wherein the fixing member has an electrically conductive protrusion on at least a portion thereof; and
wherein said protrusion is contacted with an outer conductive portion of the solar cell module or the solar cell-free module, thereby creating electrical continuity between the solar cell module or the solar cell-free module and said protrusion, when the solar cell module or the solar cell-free module is fixed.

17. A solar cell module array comprising:
a plurality of solar cell modules electrically connected to each other,
wherein a solar cell module of said plurality of solar cell modules is meshed and fixed on an installation face with a unitary fixing member;
wherein said fixing member comprises
a meshing portion to mesh at least said solar cell module;
a fixing portion to fix said fixing member to said installation face; and
a raised portion to connect said meshing portion and said fixing portion,
wherein said raised portion has a height which is greater than the thickness of a portion of said solar cell module which is engaged in the meshing by said meshing portion,
wherein said meshing portion, said fixing portion and said raised portion are integrally provided,
wherein a space is established between said solar cell module and said installation face, and
wherein contact of said solar cell module with said installation face is prevented when said solar cell module is meshed.

18. A solar cell module array according to claim 17, wherein the solar cell module is a building material integral type solar cell module.

19. A solar cell module array according to claim 18, wherein the building material integral type solar cell module is a roofing member integral type solar cell module.

20. The solar cell module array according to claim 17, wherein at least some of the electrical connection is located in said space.

21. A solar cell module array comprising:
a solar cell module arranged on an installation face;
a metallic communicating member arranged on at least a portion of said installation face situated under said solar cell module; and
an outer conductive portion of said solar cell module partially fixed by a fixing member;

wherein said fixing member comprises
- a meshing portion to mesh at least said solar cell module;
- a fixing portion to fix said fixing member to said installation face; and
- a raised portion to connect said meshing portion and said fixing portion,
- wherein said raised portion has a height which is greater than the thickness of a portion of said solar cell module which is engaged in the meshing by said meshing portion;
- wherein said meshing portion, said fixing portion and said raised portion are integrally provided;
- wherein a space is established between said portion of said solar cell module or said solar cell-free module which is engaged in the meshing and said installation face when said solar cell module or said solar cell-free module is engaged in the meshing;
- wherein the fixing member is electrically conductive, thereby exhibiting an electric potential which is the same as that of the solar cell module;
- wherein the fixing member is contacted with said outer conductive portion of the solar cell module, thereby creating electrical continuity between the solar cell module and the fixing member, when the solar cell module is fixed;
- wherein said fixing member directly contacts said metallic communicating member, thereby creating electrical continuity with said metallic communicating member or said fixing member is fixed on a supporting member by an electrically conductive jointing means, thereby creating electrical continuity with said metallic communicating member; and
- wherein said metallic communicating member is electrically grounded.

22. A solar cell module array according to claim 21, wherein the solar cell module is a building material integral type solar cell module.

23. A solar cell module array according to claim 22, wherein the building material integral type solar cell module is a roofing member integral type solar cell module.

24. An installation method comprising the steps of:
arranging a plurality of solar cell modules over an installation face;
meshing and fixing a solar cell module of said plurality of solar cell modules on said installation face using a unitary fixing member,
wherein said fixing member comprises
- a meshing portion to mesh at least said solar cell module;
- a fixing portion to fix said fixing member to said installation face; and
- a raised portion to connect said meshing portion and said fixing portion,
wherein said raised portion has a height which is greater than the thickness of a portion of said solar cell module which is engaged in the meshing by said meshing portion,
wherein said meshing portion, said fixing portion and said raised portion are integrally provided, and
wherein a space is established between said solar cell module and said installation face, and
wherein contact of said solar cell module with said installation face is prevented when said solar cell module is meshed; and
electrically connecting each of said plurality of solar cell modules with each other.

25. The installation method according to claim 24, wherein at least some of the electrical connection is located in said space.

26. An installation method comprising the steps of:
arranging a plurality of solar cell modules over an installation face;
arranging a metallic communicating member on at least a portion of said installation face situated under said solar cell modules;
fixing an outer conductive portion of each of said solar cell modules by a fixing member,
wherein said fixing member comprises
- a meshing portion to mesh at least said solar cell module;
- a fixing portion to fix said fixing member to said installation face; and
- a raised portion to connect said meshing portion and said fixing portion,
- wherein said raised portion has a height which is greater than the thickness of a portion of said solar cell module which is engaged in the meshing by said meshing portion;
- wherein said meshing portion, said fixing portion and said raised portion are integrally provided;
- wherein a space is established between said portion of said solar cell module or said solar cell-free module which is engaged in the meshing and said installation face when said solar cell module or said solar cell-free module is engaged in the meshing;
- wherein the fixing member is electrically conductive, thereby exhibiting an electric potential which is the same as that of the solar cell module; and
- wherein the fixing member is contacted with said outer conductive portion of the solar cell module, thereby creating electrical continuity between the solar cell module and the fixing member, when the solar cell module is fixed;
directly contacting said fixing member with said metallic communicating member, thereby creating electrical continuity with said metallic communicating member or fixing said fixing member on a supporting member by an electrically conductive jointing means, thereby creating electrical continuity with said metallic communicating member; and
electrically connecting each of said plurality of solar cell modules to each other.

* * * * *